(12) United States Patent
Liff et al.

(10) Patent No.: US 12,424,543 B2
(45) Date of Patent: Sep. 23, 2025

(54) SELECTIVE INTERCONNECTS IN BACK-END-OF-LINE METALLIZATION STACKS OF INTEGRATED CIRCUITRY

(71) Applicant: INTEL CORPORATION, Santa Clara, CA (US)

(72) Inventors: Shawna Liff, Scottsdale, AZ (US); Adel Elsherbini, Tempe, AZ (US); Johanna Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 638 days.

(21) Appl. No.: 16/696,808

(22) Filed: Nov. 26, 2019

(65) Prior Publication Data

US 2021/0159163 A1    May 27, 2021

(51) Int. Cl.
  *H01L 23/528*  (2006.01)
  *H01L 21/768*  (2006.01)
  *H01L 23/522*  (2006.01)
  *H01L 23/532*  (2006.01)

(52) U.S. Cl.
  CPC ...... *H01L 23/528* (2013.01); *H01L 21/76816* (2013.01); *H01L 21/76819* (2013.01); *H01L 21/76877* (2013.01); *H01L 23/5226* (2013.01); *H01L 23/53228* (2013.01)

(58) Field of Classification Search
  CPC ............. H01L 23/528; H01L 21/76816; H01L 23/53228; H01L 23/5226; H01L 21/76877
  See application file for complete search history.

(56) References Cited

U.S. PATENT DOCUMENTS

| 9,899,255 B2* | 2/2018 | Hourani | H01L 23/528 |
| 2009/0160020 A1* | 6/2009 | Barth | H01L 23/5226 |
| | | | 257/532 |

(Continued)

FOREIGN PATENT DOCUMENTS

| JP | 2003110095 A | 4/2003 |
| JP | 2006522461 A | 9/2006 |

OTHER PUBLICATIONS

Han, et al., "Performance and Energy Aware Optimization of BEOL Interconnect Stack Geometry in Advanced Technology Nodes", IEEE International Symposium on Quality Electronic Design (ISQED), Santa Clara, CA, USA, 2017.

(Continued)

*Primary Examiner* — Phat X Cao
(74) *Attorney, Agent, or Firm* — Essential Patents Group, LLP

(57) ABSTRACT

An integrated circuit (IC) device structure, comprising a host chip having a device layer and one or more first metallization levels over adjacent first and second regions of the device layer. The first metallization levels are interconnected to the device layer. An interconnect chiplet is over the first metallization levels within the first region. The interconnect chiplet comprises a plurality of second metallization levels, and a plurality of third metallization levels over the first metallization levels within the second region and adjacent to the interconnect chiplet. At least one of an interconnect feature dimension or composition differs between one of the second metallization levels and an adjacent one of the third metallization levels.

16 Claims, 14 Drawing Sheets

(56) References Cited

U.S. PATENT DOCUMENTS

2013/0027073 A1\* 1/2013 Pagani ............... G01R 31/2834
                                                    324/756.03
2018/0277526 A1\* 9/2018 Kao .................... H01L 23/5227
2019/0393153 A1\* 12/2019 Wang ...................... H01L 25/18
2020/0411445 A1\* 12/2020 Chen ...................... H01L 25/50

OTHER PUBLICATIONS

Office Action from Taiwanese Patent Application No. 109130650 notified Dec. 14, 2023, 17 pgs.
Office Action from Japanese Patent Application No. 2020-154139 notified Nov. 5, 2024, 12 pgs.
Notice of Allowance from Japanese Patent Application No. 2020-154139 notified May 28, 2025, 2 pgs.
Office Action from Japanese Patent Application No. 2020-154139 notified Mar. 11, 2025, 10 pgs.

\* cited by examiner

SELECTIVE INTERCONNECTS IN BACK-END-OF-LINE METALLIZATION STACKS OF INTEGRATED CIRCUITRY

BACKGROUND

Monolithic fabrication methods may result in certain restrictions of device architecture that may limit the performance of an integrated circuit (IC) device. Heterogeneous integration where independently fabricated IC dies are integrated within the same package (according to multi-chip packaging, wafer stacking, or die stacking techniques) may suffer high fabrication costs, lower insertion efficiencies, and large z-heights. Currently, the type of IC device (e.g., CPUs, GPUs, FPGAs, RFICs, etc.) drives the choice of interconnect layer thicknesses and dimensional design rules within back end of line (BEOL) metallization stack of the integrated circuit. Often, an IC chip foundry will provide one set of design rules for a particular technology node capable of a given performance target. However, when multiple functions are integrated within the IC according to current semiconductor processing methods, the performance or cost of certain functional blocks may be sub-optimal within the resultant integrated circuit device.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only. Views labeled "cross-sectional", "profile", "plan", and "isometric" correspond to orthogonal planes within a Cartesian coordinate system. Thus, cross-sectional and profile views are taken in the x-z plane, plan views are taken in the x-y plane, and isometric views are taken in a 3-dimensional Cartesian coordinate system (x-y-z). Where appropriate, drawings are labeled with axes to indicate the orientation of the figure.

DETAILED DESCRIPTION

Figure 1:
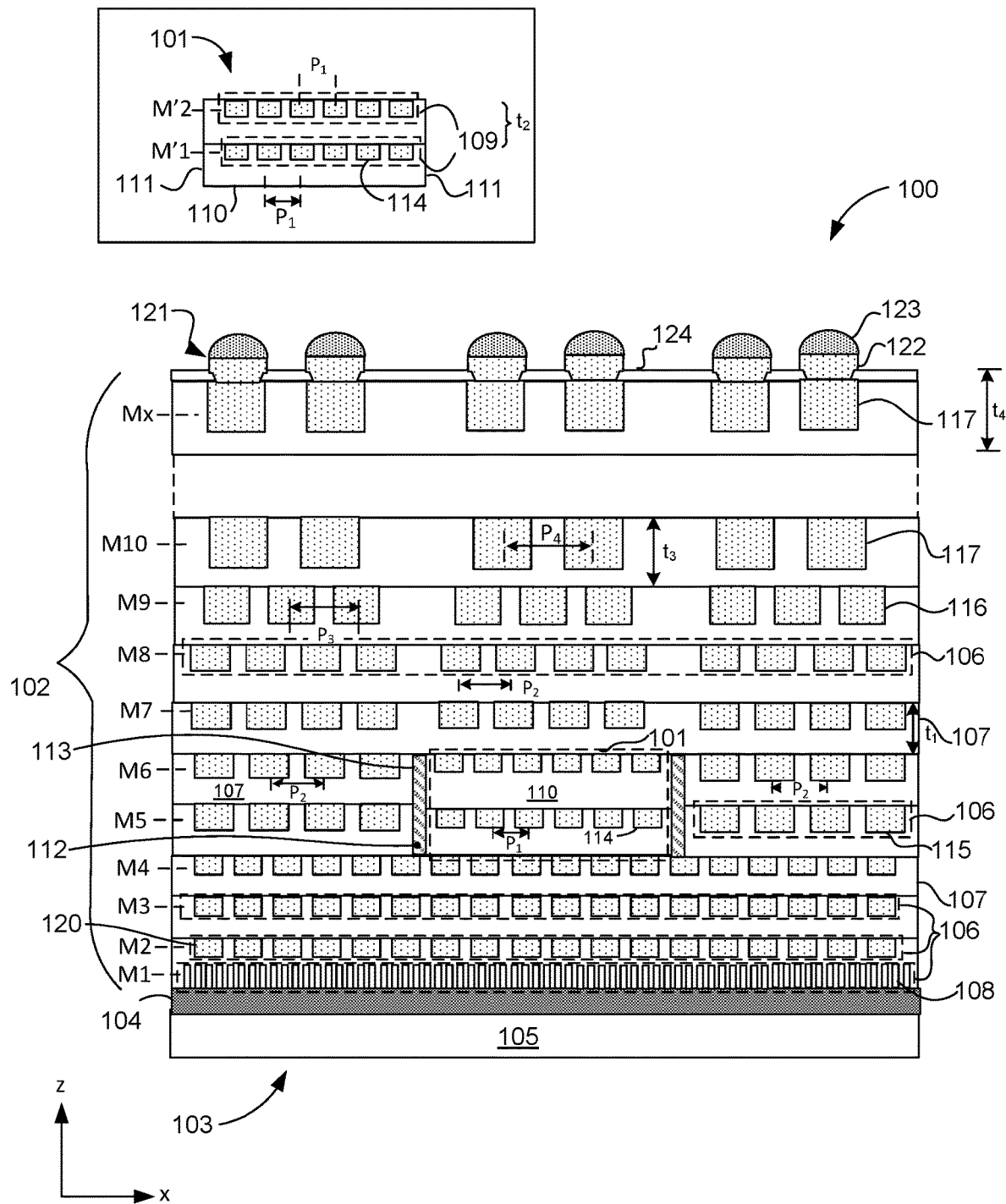
FIG. 1 illustrates a cross sectional view in the x-z plane of an exemplary composite die structure, according to some embodiments of the disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

The term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to a printed circuit board (PCB).

Here, the term "back end of the line (BEOL) generally refers to post-device fabrication operations on a semiconductor wafer. After formation of the active and passive devices within a circuit layer on the semiconductor wafer in a front-end of the fabrication line (e.g., front-end-of-the line or FEOL), a series of operations where metal features are formed (metallization) over the semiconductor devices comprise the BEOL portion of the fabrication line.

Here, the term "chiplet" generally refers to a small, thin die embedded in the BOEL metallization of a larger host die. In the described embodiments, chiplets comprise at least interconnect metallization stack and are therefore referred to herein as "interconnect chiplets." Such interconnect chiplets may include a semiconductor substrate, or not. As such, an interconnect chiplet need not include active devices, but may. Interconnect chiplets may carry specialized integrated circuits, for example, clocking circuits, active repeater banks for long-distance on-die interconnects, etc.

The meaning of "a," "an," and "the" include plural references. The meaning of "in" includes "in" and "on." The vertical orientation is in the z-direction and it is understood that recitations of "top", "bottom", "above" "over" and "below" refer to relative positions in the z-dimension with the usual meaning. Generally, "top", "above", and "over" refer to a superior position on the z-dimension, whereas "bottom", "below" and "under" refer to an inferior position on the z-dimension. The term "on" is used in this disclosure to indicate that one feature or object is in a superior position relative to an inferior feature or object, and in direct contact therewith. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Described herein is a composite integrated circuit (IC) device structure comprising one or more interconnect chiplets, selectively embedded within host back-end-of-line (BEOL) metallization levels on a host chip (die). According to embodiments disclosed herein, the interconnect chiplet(s) provide integrated circuitry on the host die with selective interconnect stack geometries and material sets to optimize performance of the host integrated circuitry. With the interconnect chiplet(s), the host integrated circuitry may comprise a composite of multi-functional subcircuits or circuit sections. Each subcircuit of the host circuitry may then have an optimal interconnect geometry design rule set for optimal performance. According to embodiments of the disclosure, suitable interconnect chiplets may be selected to satisfy multiple interconnect design rule sets that may be selectively integrated in the BEOL stack over corresponding subcircuits of the host chip. As an example, the design rules for a first subcircuit devoted to signal routing may call for a high density interconnect geometry satisfied by a first interconnect chiplet, while design rules for an adjacent second subcircuit devoted to processing or memory may call for a high performance interconnect stack geometry satisfied by the host BEOL interconnect stack, or the interconnect stack of another chiplet. Selective placement of the chiplet(s) may therefore optimize vertical interconnections between a block of integrated circuitry below the chiplet and a first level interconnect (FLI) interface layer of the host BEOL interconnect stack. The FLI interface layer may then be coupled with signal and power routing on a package or interposer substrate with any FLI architecture typical for an IC chip.

According to some embodiments disclosed herein, the composite IC device structure comprises a laterally heterogeneous BEOL metallization stack. Each of the one or more interconnect chiplets embedded in the host BEOL metallization stack generally have a different interconnect geometry and/or dielectric materials than the host BEOL metallization stack. In some embodiments, the interconnect chiplets comprise functional materials interleaved with the dielectric, such as, but not limited to, magnetic or piezoelectric materials. In some embodiments, the interlayer dielectric material of one or more of the embedded chiplet(s) is different from the native interlayer dielectric of the host BEOL metallization stack. As an example, a chiplet having a high density interconnect geometry may comprise an interlayer dielectric having a lower relative permittivity, or dielectric constant (k), than the dielectric of the host BEOL stack. The low k dielectric may reduce interelectrode capacitance between closely-spaced traces and other metallization features within the chiplet interconnect stack, enabling high-density routing of high speed data signals.

According to embodiments of the disclosure, interconnect chiplets are integrated at any layer of the host BEOL metallization stack by hybrid bonding. The interconnect chiplets may each comprise a multi-level metallization stack having a top level of metallization that interfaces with a lower metallization layer in the host BEOL stack. Feature pitches and dimensions within the interfaced metal layers may be compatible for metal-to-metal bonding of substantially overlapped opposing structures. In some embodiments, diffusion bonds are formed between the interfaced metal features resulting from the hybrid bonding process, enabling direct bonding of the chiplet to the host BEOL stack.

A hybrid bonding process may include placement of a chiplet within the BEOL metallization stack, followed by a bonding thermal anneal process. Opposing metallization structures are placed in direct contact at a bonding interface. The interface dies are subsequently subjected to the thermal anneal enabling interdiffusion of metal atoms between interfaced metallic structures. Molecular bonding between interfaced dielectrics having similar surface chemical composition or molecular structure may occur simultaneously. For example, opposing surface silanol groups of silicate-containing dielectrics may bond together by condensation reactions. The resulting chiplet-host chip composite structure may be handled as a monolithic composite chip and subsequently assembled into a package using standard package assembly tools and procedures.

The interconnect chiplet(s) may be partially or fully fabricated separately from the host chip. Partially or completely fabricated chiplets may be singulated from a donor wafer, and placed on the host chip wafer by any suitable technique (e.g., pick-and-place operation) at any stage of BEOL metallization of a host IC. The pick-and-place process may be performed with die-to-wafer bonding equipment having placement accuracy to 200 nm, or less. Such equipment may have ISO 3 or better cleanliness to ensure high-yield placement and bonding of the selective interconnect chiplets. Any alignment imprecision may be compensated by the metallization stack on the interconnect chiplets. For example, feature critical dimension may increase from an inner (lower) metallization level to an outer (upper) metallization level to a critical dimension suitable for the alignment tolerance of the subsequent process needs. Coarser features in an outermost metallization level of the interconnect chiplet may therefore match feature pitches within the host BEOL stack, tolerating some degree of offset between chiplet and host die interconnect features.

FIG. 1 illustrates a cross sectional view in the x-z plane of composite die structure 100, according to some embodiments of the disclosure.

Composite die structure 100 comprises interconnect chiplet 101 (delineated by the dashed enclosure), integrated within a common metallization stack (BEOL stack 102) on host chip 103. BEOL metallization stack 102 comprises multiple metallization levels M1 through Mx, coupled to device layer 104. Substrate 105 comprises a semiconductor material, the top 50-1000 nm of which may comprise transistors and/or other active and passive devices in device layer 104, for example. In some embodiments, substrate 105 comprises one or more semiconductor materials such as, but not limited to, silicon (Si), germanium (Ge), silicon germanium (SiGe), gallium arsenide (GaAs), gallium phosphide (GaP), gallium nitride (GaN), gallium indium nitride (GaInN), or indium phosphide (InP). In some embodiments, substrate 105 is a silicon on insulator (SOI) chip, having a buried oxide (BOX) layer several microns below the surface. Device layer 104 may be formed in the semiconductor material above the BOX layer. Device layer 104 may have a thickness ranging up to 100 to 1000 nm, and is integral with substrate 105, which may have a thickness ranging up to 775 microns. In other embodiments, substrate 105 is a bulk silicon substrate and device layer 104 is merely an upper portion of the bulk substrate.

In some embodiments, host chip device layer 104 comprises active devices, passive devices or a combination of active and passive devices. Active devices may include arrays of field-effect (FET) or bipolar junction transistors arranged in logic circuits. Feature pitches, defined as distances between like interconnect terminals over gate, source or drain regions of individual transistors may range between 20 and 1000 nanometers (nm). For example, gate-to-gate pitches may be between 40-80 nm.

Host chip BEOL metallization stack 102 comprises one or more conductive layers 106 embedded in interlayer dielectric (ILD) 107. A first metallization level M1 of the BEOL stack comprises interconnect features (e.g., vias 108) coupled to gate, source and drain terminals. Vias 108 have a pitch that may range, for example, between 40 to 1000 nm. Vias 108 may be interconnected to metallization features 120 in level M2. In the illustrated embodiment, four BEOL conductive layers 106 (designated as metallization levels M1-M4) are shown below interconnect chiplet 101, but interconnect chiplet 101 may be attached at any suitable level within BEOL metallization stack 102.

In some embodiments, conductive layers 106 comprise metals such as, but not limited to, copper, copper-aluminum alloy, aluminum, silver, gold, nickel, indium, and tungsten, cobalt, tungsten, tantalum, and titanium. Interlayer dielectric (ILD) layers 107 comprise materials such as, but are not limited to, silicon oxides (e.g., $Si_xO_{1-x}$), silicon nitrides (e.g., $SixN_{(1-x)}$), silicon oxynitrides (e.g., $SiOxN_{(1-x)}$), silicon carbide (e.g., SiC) and silicon carbide nitrides (e.g., $SiC_xN_{1-x}$), aluminum oxides, and aluminum nitrides. In some embodiments, ILD layers 107 comprise low-k materials having a relative permittivity below that of $SiO_2$ (e.g., k≤3.9). ILD layer(s) 107 may comprise any of the above materials or a silicate glass, such as, but not limited to, fluorosilicate glass (FSG), phosphosilicate glass (PSG), borophosphosilicate glass (BSG) or undoped silicate glass (USG), organosilicate glass (OSG—e.g., carbon-doped oxide, CDO) porous OSG, and porous silicon dioxide. In some embodiments, one or more of ILD layers 107 may comprise low-k organic polymeric materials such as polyimides, hydrogen silsesquioxane and methyl silsesqjuioxane. The above dielectric materials may be formed by spin coating methods (e.g., spin-on glass, SOG), chemical vapor deposition (CVD) or sol gel techniques.

Layer thicknesses for both conductive layers 106 and dielectric layers 107 may range from 50 nm, or less, in the lower levels proximal to substrate 105, to 5 microns, or more, in the upper levels near the top of the BEOL metallization levels 106. Metallization features within the conductive layers 106 may include horizontal traces, for example. In the figure, metallization features (e.g., features 114, 115, 116) are represented as traces shown in cross-section. Inter-level vias (not shown) may extend through dielectric layers (ILDs) 107 between conductive layers 106. In some embodiments, minimum feature size and pitch may fan out (e.g., increase with increasing distance) from device layer 104. Upper-most metallization levels (e.g., levels highest in the stack) may have the largest pitches, indicated by pitch P3 (greater than P1, P2, P4 and P5).

A first level interconnect (FLI) interface metallization level Mx is shown over the lower levels of host BEOL stack 102. The figure shows level Mx floating over the lower levels of BEOL stack 102 to emphasize that Mx may be attached to BEOL stack 102 above M10 or any higher level not shown in the figure. The FLI interface 121 comprises FLI pads or pillars 122 and solder bumps 123. Pads 122 may be extend from metallization features 117 (e.g., traces) in level Mx. Solder bumps 123 are one example of FLI metallization that may be coupled to FLI pads 122. Solder mask layer 124 may optionally be over ILD 107 of top level Mx, between FLI pads 122. Any other FLI metallization suitable for interconnecting an IC may be applied in the alternative.

An exemplary embodiment of interconnect chiplet 101 is also illustrated in the inset of FIG. 1, separate from composite die structure 100 to more clearly indicate referenced features. In some embodiments, chiplet 101 comprises one or more metallization stack levels that have a structure different than host chip BEOL stack 102. Chiplet 101 comprises chiplet metallization levels 109, labelled M'1 through M'2, interleaved with chiplet interlayer dielectric (ILD) 110. While two metallization levels are shown, chiplet 101 may comprise any number of metallization levels. Referring now to composite die structure 100, sidewalls 111 of interconnect chiplet 101 form discontinuities with layers 106 and 107 in BEOL metallization stack 102. In some embodiments, a fill dielectric 112 is incorporated between chiplet sidewalls 111 and interfacing BEOL stack sidewalls 113. Fill dielectric 112 may fill gaps between interconnect chiplet 101 sidewalls 111 and host BEOL stack 102, where sidewalls 113 define a recess in BEOL stack 102 in which interconnect chiplet 101 has been inserted. In some embodiments, interconnect chiplet metallization layers 109 (e.g., M'1-M'2) have thicknesses $t_2$ similar to thicknesses $t_1$ of host BEOL stack conductive layers 106, ranging between 100 nm and 5 microns (5000 nm). In some embodiments, chiplet metallization layers 109 are substantially aligned with host BEOL stack conductive layer 106. As an example, in the illustrated embodiment, chiplet metallization levels M'1-M'2 are substantially planar with levels M5-M6 in host BEOL stack 102, where chiplet level M'1 is in plane with host BEOL stack level M5, chiplet level M'2 is in plane with host BEOL stack level M6.

In some embodiments, interconnect chiplet 101 has higher interconnect density than adjacent host BEOL metallization. For example, interconnect chiplet 101 may be integrated over a region of device layer 104 requiring a higher density of signal-carrying traces in the overlying lower metallization levels than adjacent regions of device layer 104 require. In the illustrated embodiment, the metallization density of at least some lower metallization levels of interconnect chiplet 101 differs from adjacent metallization density in adjacent levels in host BEOL metallization stack 102. For example, metallization features 114 in chiplet metallization levels M'1 and M'2 have a minimum feature pitch P1 that is smaller than the minimum feature pitch P2 of adjacent metallization features 115 in BEOL stack levels M4 and M5. Both chiplet and host BEOL metallization features 114 and 115 may be trace routing, shown in cross-section. Buried pads and inter-level vias may also be included as metallization features, although not shown in the figure. The smaller feature pitch P1 (and feature critical dimension, CD, such as feature width and/or thickness) in at least some metallization levels may enable chiplet 101 to have higher density interconnects in lower metallization levels of the chiplet stack than in adjacent host metallization levels 106. For example host BEOL metallization features 115 have a minimum feature pitch P2, which may be substantially greater than minimum feature pitch P1 between chiplet metallization features 114 of interconnect chiplet 101 and metallization features 120 in the lower metallization levels.

Common host stack metallization is above the level of chiplet 101 (e.g., starting at M7), such that chipet 101 is buried within the host stack. The higher metallization levels of host BEOL stack 102 above chiplet 101 may comprise any damascene-type interconnect structures following a set design rule that may define feature pitches as well as CDs and layer thicknesses in host BEOL stack 102. A decrease in interconnect density with a concomitant increase in feature pitch and size in the higher metallization levels may enable a transition from submicron feature pitches at the device layer (e.g., transistor gate pitches of 100 nm or less) to micron or greater pitches at the top-most level of the metallization stack (e.g., FLI interface 121 in level Mx in host BEOL stack).

As shown in FIG. 1, features 114 in chiplet levels M'1 and M'2 have a reduced feature pitch relative to adjacent common host metallization. For example, minimum feature pitch P1 of chiplet metallization features 114 is substantially smaller than minimum pitch P2 of corresponding features 115 in adjacent host BEOL stack levels M5 and M6. The minimum feature pitch P2 is also common in host BEOL levels M7 and M8 above chiplet 101, and may be scaled to increment from pitch P1 in chiplet levels M'1 and M'2 as well as scaled to incremented pitch P3 in host level M8.

For clarity, vertical interconnects, such as interlevel vias extending from traces or buried pads in each metallization layer are not depicted. In some embodiments, exposed pads (not shown) terminating interlevel vias at the bottom of chiplet 101 in M'1 are bonded to exposed pads in host metallization level M3. In some embodiments, an offset is present between bonded pads and other bonded interfacial structures such as traces. In some embodiments, native materials are substantially the same in both the interconnect chiplet 101 and in host BEOL stack 102. In some embodiments, native stack materials are substantially different in the two multi-level interconnect structures.

Chiplet 101 integration into host BEOL stack 102 interrupts common stack design rules over selected portions of device layer 104 by selectively replacing segments of host conductive layers 106 with chiplet segments having a higher interconnect density than laterally adjacent host metallization, which may be sufficient for adjacent circuitry. Circuitry performance in device layer 104 below chiplet 101 may be optimized by the higher interconnect density to which it is connected. Multiple chiplets may be integrated elsewhere within host BEOL stack 102 over circuitry requiring high-density interconnect metallization to optimize performance.

In FIG. 1, thicknesses (e.g., thickness $t_2$) of chiplet metallization layers are shown to be approximately the same as host BEOL metallization level thickenesses (e.g., thickness t1). Differences between thicknesses of laterally adjacent layers may be large, and in general chiplet and host layers may not be in the same plane according to the example shown in FIG. 1. In other embodiments, chiplet 101 may have smaller metallization densities than adjacent host BEOL layers, as described below.

In some embodiments, the material compositions of the conductive layers 106 and dielectric layers 110 are substantially the same as described above for BEOL metallization levels 106. For example, thicknesses of layers 115 and 116 may range from 10-100 nm for the lower-most levels (e.g., level M'1), up to 8 microns in the highest levels. Size and pitch of features may increase from level to level, as noted above, from a minimum of 10-100 nm pitch for transistor interconnects within level M'1 (if directed attached to device layer 104) to 10 micron pitch (e.g., pitch P3).

In some embodiments, interconnect chiplet 101 is hybrid-bonded to BEOL metallization stack 102 (e.g. at metallization level M3). Consequently, metallization features 120 in host BEOL level M3 and chiplet metallization features 114 in chiplet metallization level M'1 may be fused together by diffusion bonds. Some offset of adjacent metallization features may be present in composite interconnect structures resulting from the bonding of two interconnect features due to chiplet-to-host positioning inaccuracies, as described below. Externally applied adhesives or solder need not be employed to accomplish such bonding.

Diffusion bonds may be characterized by metallic inter-diffusion of metal atoms between adjacent pads. Similarly, adjacent dielectric layers 107 of BEOL metallization stack 102 and dielectric layer 110 of chiplet metallization features 114 are fused, for example by formation of covalent bonds (e.g., Si—O—Si bonds) between dielectric layers 107 and 110.

High-speed I/O data signals may be routed from a package substrate or interposer (not shown) through top layer metallization FLI pads 122 and solder bumps 123. Chiplet 101 may be inserted and integrated into host BEOL stack 102 above a section of circuitry in device layer 104 that requires high-density routing to optimize performance. The circuit may comprise a high transistor density. High density routing may be necessary for signal routing compatible with underlying circuitry in the region of device layer 104 below chiplet 101.

In some embodiments, fill dielectric layer 112 may fully surround chiplet sidewalls 111, embedding chiplet 101 within dielectric material. Fill dielectric 112 may fill gaps between sidewalls of a well structure formed in host BEOL stack 102 to receive interconnect chiplet 101. The well footprint (described below) is generally larger in area (footprint) than that of interconnect chiplet 101 to accommodate insertion of the chiplet. Fill dielectric layer 112 may backfill any space remaining after insertion of chiplet 101. Fill dielectric 112 may comprise a material of different composition than ILD 107. As an example, fill dielectric 112 may comprise a material having a larger permittivity (k) than ILD 107. In some embodiments, fill dielectric 112 comprises an inorganic dielectric material, such as, but not limited to, amorphous and polycrystalline silicon oxides, in some cases having a higher k than ILD materials. In some other embodiments, fill dielectric layer 112 comprises an organic material, such as, but not limited to, epoxy resins and epoxy resin composites. As will be described later, a fill dielectric may also be employed between interconnect chiplet 101, (e.g., between M'1 and M3 of BEOL stack 102). Chiplet 101 may be bonded to fill dielectric 112.

Figure 2:
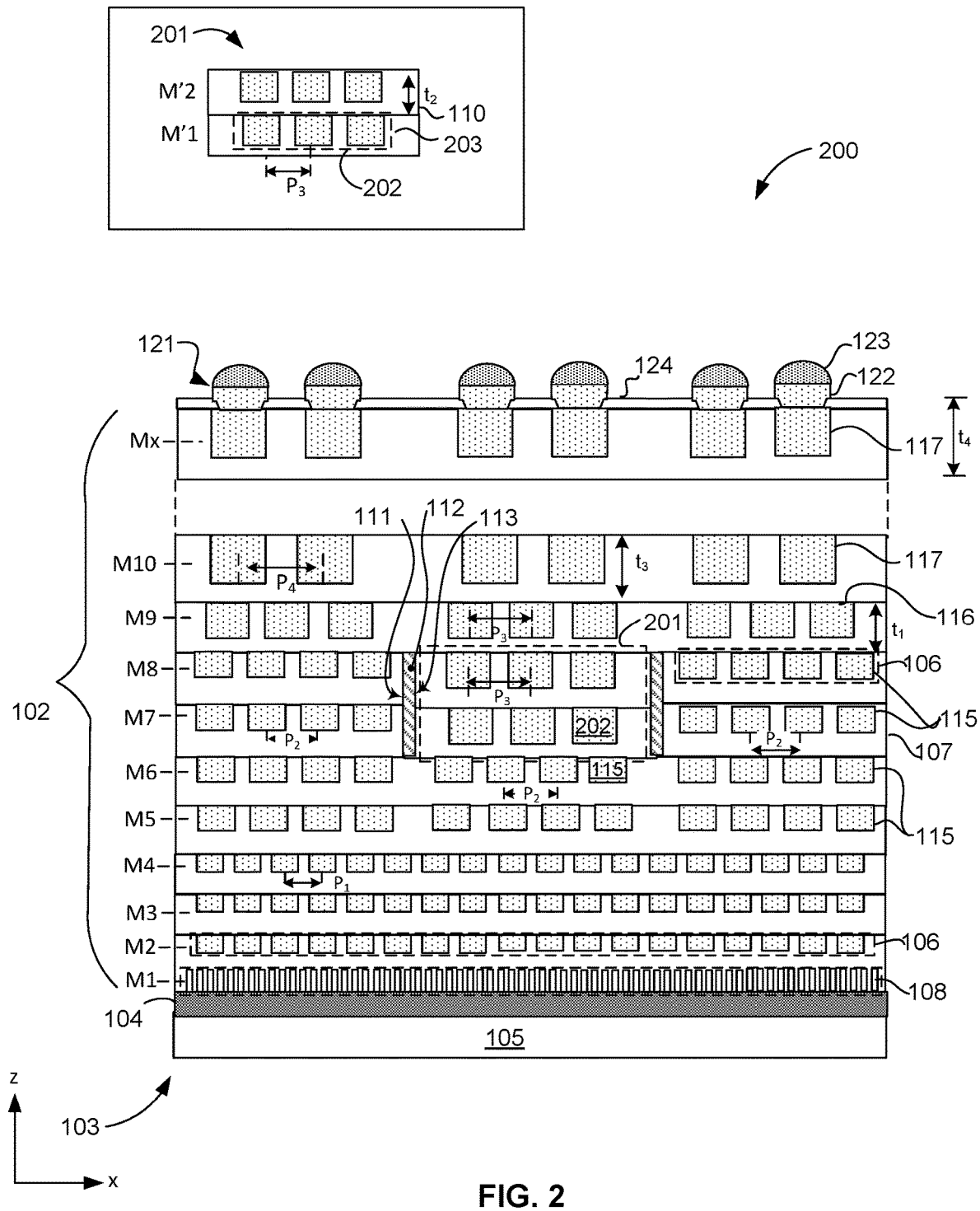
FIG. 2 illustrates a cross-sectional view in the x-z plane of an exemplary composite die structure, according to some embodiments of the disclosure.

FIG. 2 illustrates a cross-sectional view in the x-z plane of composite die structure 200, according to some embodiments of the disclosure.

Composite die structure 200 comprises interconnect chiplet 201 integrated within host BEOL metallization stack 102. Although interconnect chiplet 201 is shown having four metallization levels M'1-M'2, it is understood that any number of suitable metallization levels may be employed. Materials and dimensions employed in forming ILDs 110 and metallization layers 109 may be as described above.

A stand-alone view of interconnect chiplet 201 is shown in the inset of FIG. 2 to more clearly illustrate the referenced features. The chiplet metallization structures 202 of chiplet metallization layers 203 are embedded within ILD 110. In some embodiments, metallization structures are horizontal traces. Metallization layers 203 comprise chiplet metallization levels M'1 and M'2 having a minimum feature pitch of P3.

Referring again to composite die structure 200, chiplet 201 is embedded in common host BEOL stack 102 at levels M7 and M8. Pitch P3 of chiplet metallization features 202 is larger than pitch P2 of the horizontally adjacent higher-density host metallization structures (e.g., host metallization structures 115) in host BEOL stack levels M6 and M7. Adjacent host metallization structures 115 have a smaller CD than chiplet metallization structures 202, which are shown to have a greater thickness than structures 115. Pitch P3 may be substantially as large as, or smaller than, the minimum feature pitch of vertically adjacent metallization features in higher host level above chiplet 201 (e.g., metallization structures 116 in level M9). In the illustrated embodiment, host BEOL metallization structures 116 have a minimum feature pitch P3 that is substantially the same as the minimum feature pitch of chiplet metallization features 202. In alternate embodiments, other feature CDs and pitch may be employed.

Accordingly, the metallization density of interconnect chiplet 201 is lower than adjacent host BEOL metallization, where metallization features may have larger CDs (see inset) in comparison to CDs of features 115 in adjacent host BEOL metallization levels, As an example, metallization features 202 have a minimum feature pitch of P3, larger than feature pitch P2 of the common metallization immediately adjacent to chiplet 201. Chiplet 201 may be integrated over a circuit within device layer 104 requiring high-current carrying capacity. The larger CDs and lower density of metallization features, such as traces shown in FIG. 2, may follow design rules for the circuit interconnected by chiplet 201. Interconnections to device layer 104 are fewer than in a section of circuitry having a high transistor density for supporting large signal densities, as described above. In implementations, chiplet 201 may have a role for power transfer between an FLI interface layer (e.g., host BEOL level Mx) to device layer 104.

Figure 3:
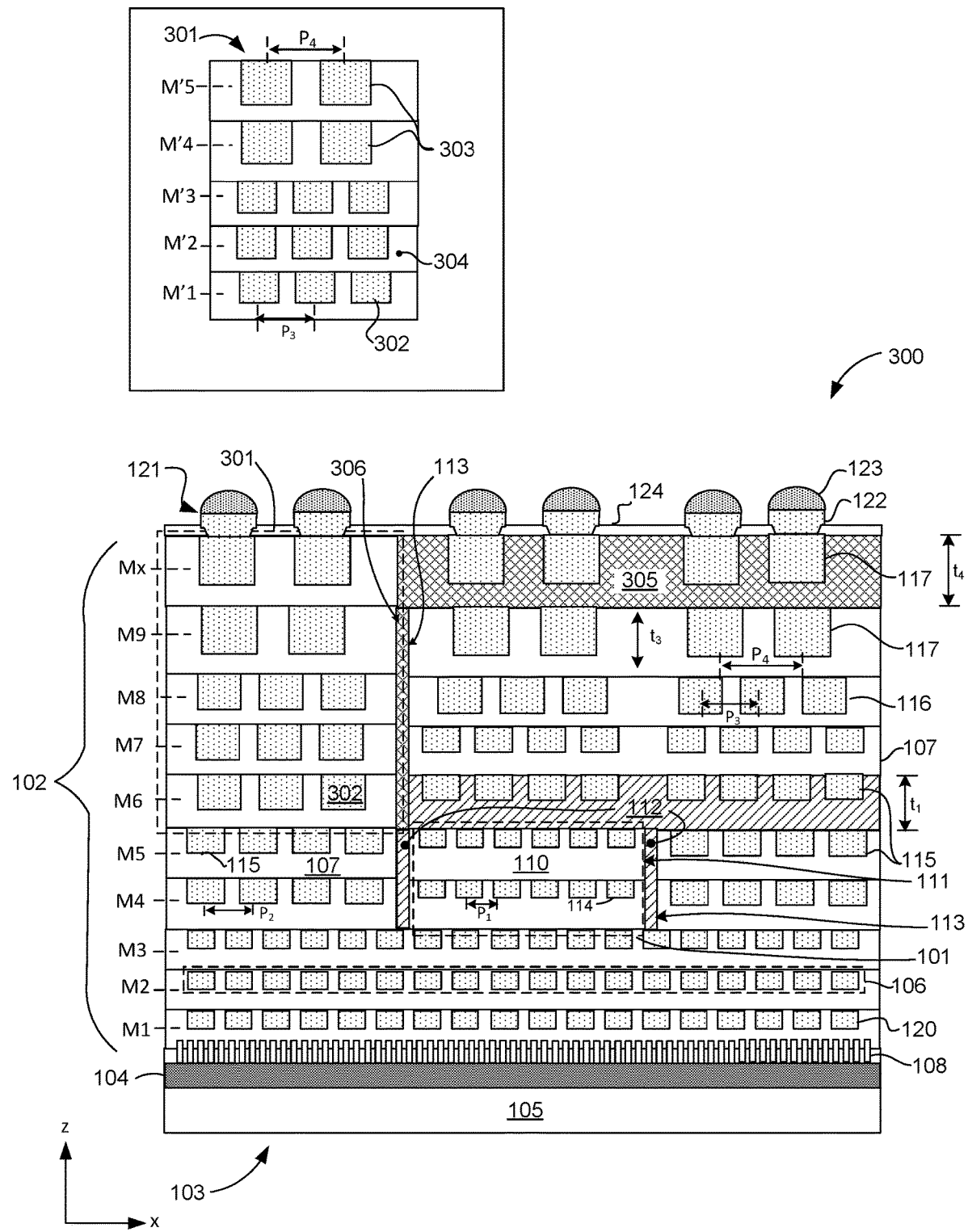
FIG. 3 illustrates a cross-sectional view in the x-z plane of an exemplary composite die structure, according to some embodiments of the disclosure.

FIG. 3 illustrates a cross-sectional view in the x-z plane of composite die structure 300, according to some embodiments of the disclosure.

Composite die structure 300 comprises interconnect chiplets 101 and 301 embedded in host BEOL metallization stack 102 of host chip 103. In the illustrated embodiment, interconnect chiplet 301 is shown to be immediately adjacent to interconnect chiplet 101. In alternative embodiments, interconnect chiplets may be distributed over non-adjacent portions of host chip 103. Referring to the inset, interconnect chiplet 301 comprises a stack of five metallization levels, M'1-M'S, having metallization features 302 and 303 embedded in ILD 304 within levels M'1-M'3 and M'4-M'5, respectively. In some embodiments, ILD 304 comprises substantially the same dielectric material employed in native host ILD 107. Metallization features 302 and 303 may have substantially the same CDs and pitches (e.g., pitches P3 and P4) as metallization features 116 and 117, respectively, in host BEOL stack 102. In composite die structure 300, interconnect chiplet 301 is attached five levels below top host level Mx such that chiplet level M'S forms part of top metallization host level Mx. Level Mx indicates that host BEOL stack 102 comprises more than one layer above M9, host stack 102 may terminate at Mx, where Mx is M10. In alternate embodiments, interconnect chiplet 301 may be integrated into host BEOL stack 102 at any suitable level, including at level M1 adjacent to device layer 104.

Interconnect chiplet 101 comprises a stack of two metallization levels and is embedded deeper within host BEOL stack 102 than interconnect chiplet 301, which extends to the top level Mx of the host stack. Interconnect chiplet is embedded within fill dielectric 112, filling the gaps between chiplet sidewalls 111 and sidewall 113 of an excavated portion of host BEOL stack 102. Additionally, fill dielectric 112 is over chiplet 101, replacing a portion of the ILD dielectric layer 107 in level M6. In the illustrated embodiment, fill dielectric 112 may have a lateral extent within M6 across the entire host substrate 105, or only over a portion thereof. Fill dielectric 112 may be formed over level M5 of host BEOL stack 102 after attachment of interconnect chiplet 101 to fill gaps between sidewalls 111 and 113. The thickness t1 of the layer of fill dielectric 112 may be adjusted to match the layer thickness for M6 according to the design rules. In some embodiments, incorporation of fill dielectric 112 within M6 is an alternative to complete removal of excess fill dielectric 112 down to M5 and subsequent deposition of native ILD 107. Metallization features 115 may be formed in fill dielectric 305 in M6 and any coplanar native ILD 107 by a Damascene process, as will be described below.

Host metallization features 115 embedded in the layer of fill dielectric 305 in level M6 may follow substantially the same design rules as do metallization features 115 (e.g., same CD and minimum feature pitch P2) in levels M4, M5 and M7. Metallization features 114 of interconnect chiplet 101 may have a minimum feature pitch P1 that is substantially the same as the smaller metallization feature pitches for features 120 in lower levels of host stack 102.

Although interconnect chiplet 301 appears to be proximal to interconnect chiplet 101 in the figure, it may be selectively integrated at a more distant location within host BEOL stack 102. Interconnect chiplet 301 may be inserted within a recess in host BEOL stack 102 (described below) that extends from top level Mx to level M5 at the bottom of the recess. Dielectric and metallization feature 302 at bottom-most level M'1 of interconnect chiplet 301 may be directly bonded to the native ILD 107 and to metal features 115 within host level M5, as described below. Externally applied adhesives or solder need not be employed to accomplish such bonding.

A second fill dielectric 305 is incorporated between sidewall 306 of interconnect chiplet 301 and sidewall 113 of the recess described below) in BEOL stack 102. In some embodiments, fill dielectric 305 comprises substantially the same material as employed in fill dielectric 112. In some embodiments, fill dielectric 305 comprises substantially the same material as employed in native ILD 107. In some embodiments, fill dielectric 305 comprises substantially the same material as employed in chiplet ILD 304. In some embodiments, fill dielectric 305 comprises a lower performance dielectric material than that employed in ILD 107. For example, fill dielectric 305 may be afforded a higher permittivity than native ILD 107. A higher permittivity may be sufficient in upper stack layers as capacitive coupling between the larger metallization features may be reduced relative to that in lower stack levels having smaller feature pitch. Fill dielectric 305 may be incorporated into host level Mx by a process similar to that employed for incorporation of fill dielectric 112 at level M6.

Fill dielectric 305 extends laterally over level M9 from sidewall 306 of chiplet 301, and may be contiguous with fill dielectric 112 incorporated between sidewalls 306 and 113. Fill dielectric 305 may form at least part of the ILD in Mx. In some embodiments, fill dielectric 305 has a thickness t4 that may be in accordance with common design rules for host BEOL stack 102. Top host metallization features 117 may be formed within fill dielectric 305 by a Damascene process (described below).

In the illustrated embodiment, top metallization level M'S of interconnect chiplet 301 is substantially aligned with host level Mx, and comprises metallization features 303 that may be substantially the same size (e.g., CD) and have the same pitch (e.g., P4) as those of adjacent host metallization features 117.

As shown, interconnect chiplet 301 has a lower interconnect density than adjacent common host stack metallization, enabling larger power handling (therefore higher performance) for interconnected circuitry in device layer 104 directly below chiplet 301. Features 114 in interconnect chiplet 101 replaces common host metallization features 115 in M4 and M5 that have larger size and pitch than features 114. Conversely, interconnect chiplet 101 provides a higher density of interconnects for circuitry in device layer 104 interconnected to chiplet 101, enabling optimized performance of the interconnected circuits that require a high density of interconnects.

FIGS. 4A-4D illustrate partial cross-sectional views in the x-z plane of functional chiplets 400A-D, according to some embodiments of the disclosure.

Figure 4A:
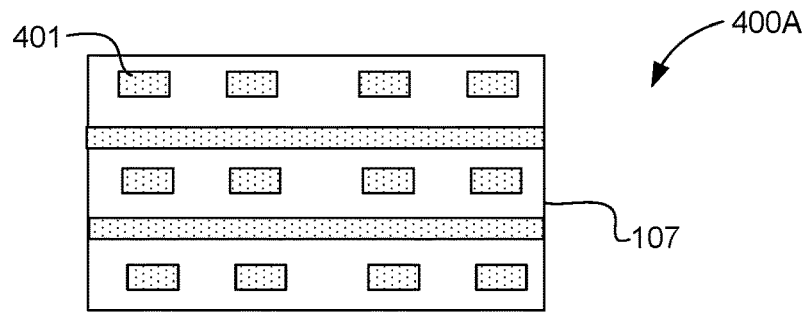
FIGS. 4A-4D illustrate partial cross-sectional views in the x-z plane of functional chiplets, according to some embodiments of the disclosure.

Interconnect chiplets disclosed herein (e.g., chiplets 101, 201 and 301) may comprise functional materials in addition to ILD dielectics and conductive layer structures. In FIG. 4A, a portion of interconnect chiplet 400A is shown in cross-section. Chiplet 400A may comprise neutral ILD dielectric 107. ILD dielectric 106 may comprise silicate materials or polymeric materials as described above for interconnect chiplets 101, 201 and 301. ILD 106 may have the sole function of providing electrical insulation for metallic features 114 and 401. The dielectric materials employed may have a relatively high dielectric constant (k, or relative permittivity of 3.9 or higher) as metallization density may be relatively low. Design rules for the density of metallization may not include need for low-k dielectric materials having relative permittivity of 3.9 or less.

Figure 4B:
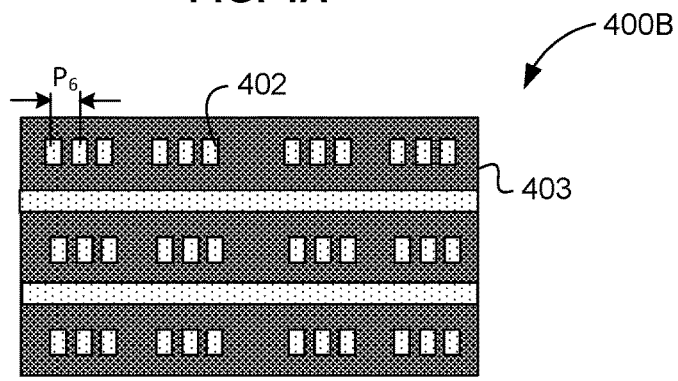

In FIG. 4B, a portion of interconnect chiplet 400B is shown in cross-section. Interconnect chiplet 400B comprises high-density metallization features 402 embedded in a low-k dielectric (e.g., k less than 3.9). High-density metallization features 402 may have a pitch P6 that is less than 1000 nm. Close proximity of metallization features 402 may necessitate a high degree of dielectric insulation. ILD 403 may comprise a low-k dielectric such as fluorosilicate glass (FSG), carbon-doped oxide, porous organosilicate glass, and porous silicon dioxide.

Figure 4C:
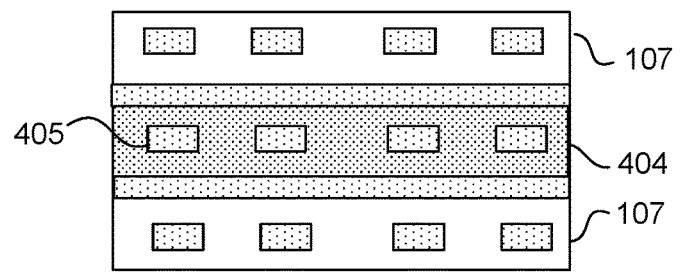

In FIG. 4C, a portion of interconnect chiplet 400C is shown in cross-section. Interconnect chiplet 400C comprises a magnetic layer 404 sandwiched between two non-magnetic dielectric layers 107. Magnetic layer 404 may comprise a magnetic dielectric, such as a ferrite material, (dilute) magnetic semiconductor or a material comprising powered iron oxide. In some embodiments, magnetic layer comprises a ferrite or dielectric rare-earth material dispersed in a non-magnetic dielectric matrix. In some embodiments, magnetic layer 404 comprises a metallic magnetic material, such as, but not limited to, transition metals cobalt, iron, nickel, and rare earth metals such as, but not limited to, neodymium, dysprosium and samarium. IN some embodiments, magnetic layer 404 is a sheet of magnetic material sandwiched between dielectric layers 107 or a semiconductor layer doped with magnetic dopant atoms. Metal features 405 are optional in magnetic layer 404, and may be omitted for employment of conductive magnetic materials. IN some embodiments, metal features 405 are inductor windings embedded in a magnetic core formed by magnetic layer 404.

Figure 4D:
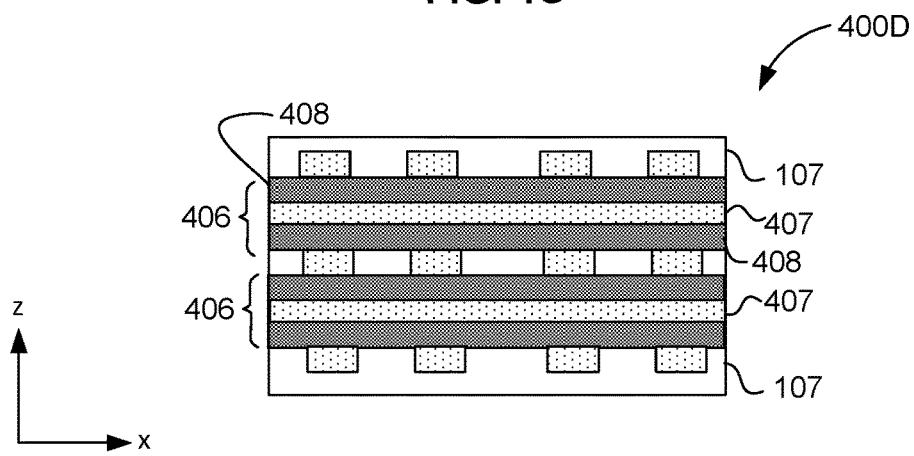

In FIG. 4D, a portion of interconnect chiplet 400D is shown in cross-section. Interconnect chiplet 400D comprises embedded piezoelectric devices 406. Metallization layers 407 may be sandwiched between piezoelectric layers 408. Metallization layers 407 are in intimate contact with both piezoelectric layers 408, and may function as contact electrodes for piezoelectric devices 406. Piezoelectric layers 408 may be confined to a single metallization layer, or extend over multiple metallization layers. Materials employed for piezoelectric layers 408 may substitute for a non-functional ILD material that is employed for ILD 107, and comprise piezoelectric polycrystalline ceramic materials, such as, but not limited to, barium titanate, lead titanate, lead zirconium titante, potassium niobate, bismuth ferrite, lithium tantalite, and sodium tungstate. Piezoelectric devices 406 may be employed as actuators, surface acoustic wave sensors and transducers and integrated piezoelectric elements for clocks and oscillators.

Figure 5A:
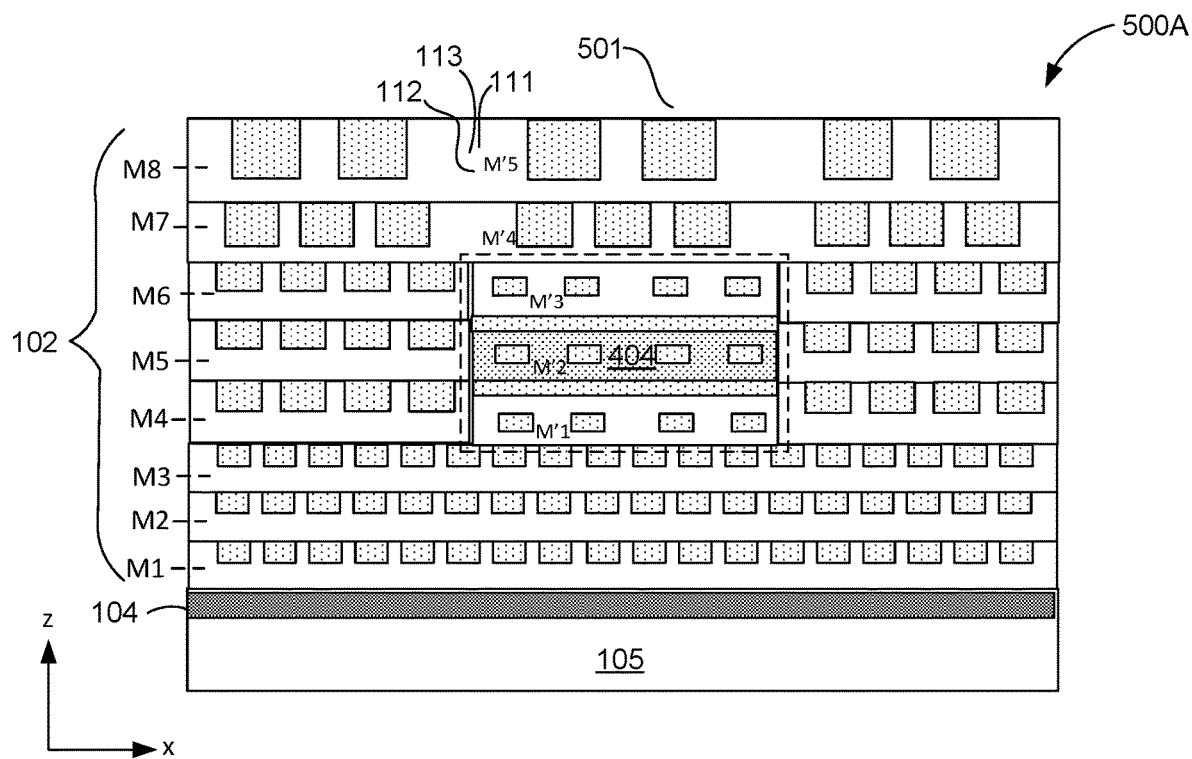
FIGS. 5A and 5B illustrate cross-sectional views in the x-z plane of composite die structures comprising chiplets having functional materials integrated in BEOL with interconnect chiplet, according to some embodiments of the disclosure.
Figure 5B:
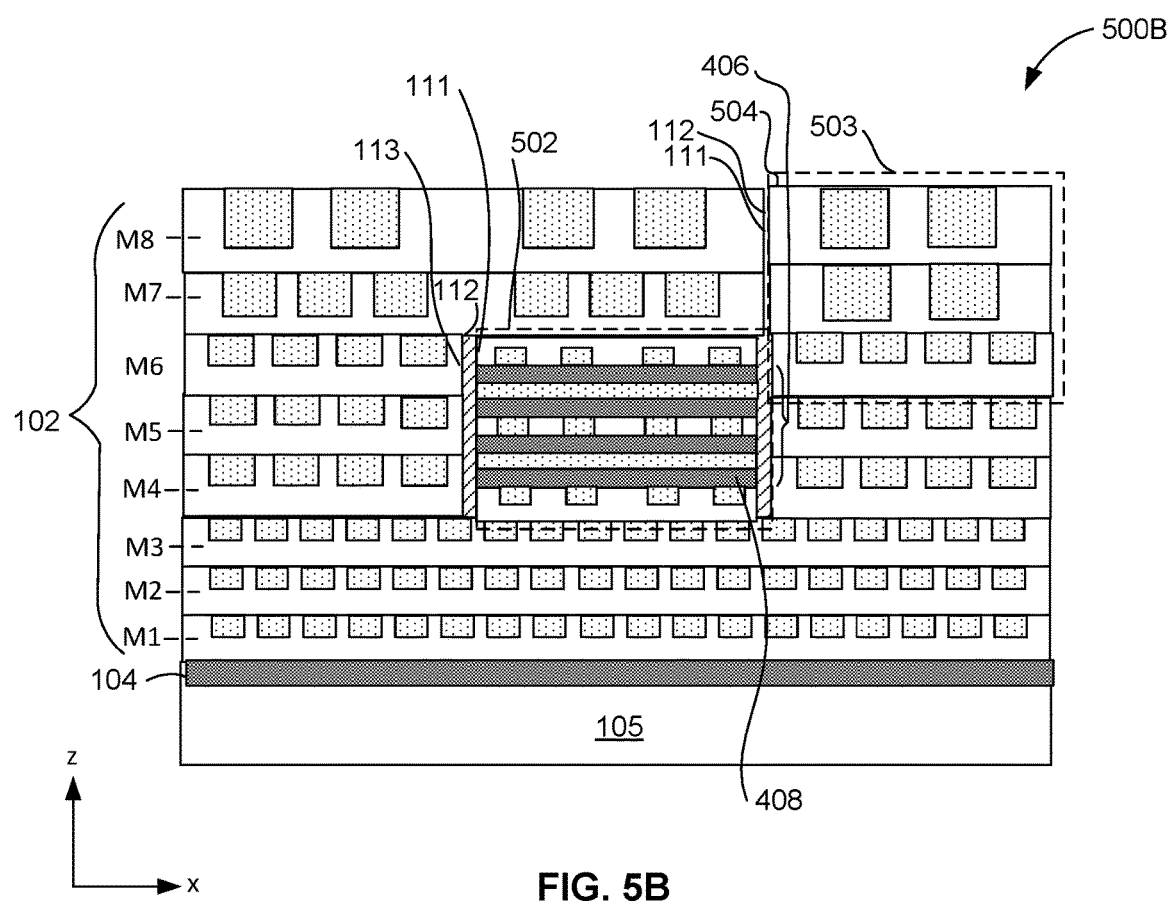

FIGS. 5A and 5B illustrate cross-sectional views in the x-z plane of composite die structures 500A and 500B comprising chiplets having functional materials integrated in BEOL with interconnect chiplet, according to some embodiments of the disclosure.

In FIG. 5A, composite die structure 500A comprises interconnect chiplet 501, delineated by the dashed enclosure, comprising magnetic layer 404. Chiplet 501 is integrated into host BEOL stack 102 over host chip device layer 104 and substrate 105, as described above for interconnect chiplets 101, 201 and 301. Magnetic layer 404 may be confined to a single metallization layer, as shown in the illustrated embodiment, or extend over multiple metallization layers. In some embodiments, fill dielectric 112 may at least partially surround chiplet 501, filling a space between chiplet sidewalls 111 and host BEOL stack sidewalls 113. Chiplet 501 may be hybrid bonded to host BEOL stack 102 at level M3.

Chiplet 501 may comprise an inductor structure that has been inserted into BEOL stack 102, which electrically couples to an underlying section of integrated circuitry in device layer 104. Magnetic layer 404 may improve inductor figures of merit. In the illustrated embodiment, chiplet 501 comprises metallization layers M'1 through M'5. Magnetic layer 404 is in M'2, and may occupy the layer entirely or partially. Magnetic layer 404 may extend over multiple metallization layers. As such, chiplet 501 can be fabricated at the wafer level, singulated, and integrated into a wide range host IC structures without requiring the host IC fabrication process to accommodate complexity of magnetic structures.

In FIG. 5B, composite die structure 500B comprises chiplet 502 (delineated), comprising piezoelectric devices 406, and interconnect chiplet 503 (delineated) adjacent to chiplet 502. Host BEOL stack sidewall 113 is adjacent to sidewall 111 of chiplet 502 (right side in the figure), flanking fill dielectric 112. In some embodiments, fill dielectric 112 at least partially surrounds chiplet 502. Chiplet 503 is a passive interconnect stack to and may provide a region of high interconnect density or low interconnect density relative to surrounding native host BEOL stack 102, to connect a section of circuitry in device layer 104 requiring a low density, high performance metallization stack to a top FLI level (not shown in FIG. 5A or 5B, but similar to FLI level Mx in FIGS. 1, 2 and 3). Piezoelectric devices 406 may be coupled to a section of integrated circuitry in device layer 104 below chiplet 502, through host BEOL metallization layers M1-M3. In some implementations, circuitry coupled to piezoelectric devices 406 may activate the piezoelectric motion of piezoelectric layers 408 for oscillations needed for clocking functions, radio frequency (rf) generation, etc. In some implementations, piezoelectric devices 406 may provide sensing functions, such as sensing acceleration, or enable active capacitor tuning. As such, chiplet 502 can be fabricated at the wafer level, singulated, and integrated into a wide range host IC structures without requiring the host IC fabrication process to accommodate complexity of piezo-electric structures.

Interconnect chiplet 503 is shown adjacent to chiplet 502, sidewall 504 of chplet 503 separated from sidewall 111 of chiplet 502 by fill dielectric 112. In some embodiments, interconnect chiplet 503 is integrated in a greater distance away from chiplet 502. Sidewall 111 of chiplet 502 and sidewall 504 of chiplet 503 may be directly adjacent to host BEOL stack sidewalls (e.g. BEOL stack sidewall 113).

Figure 6A:
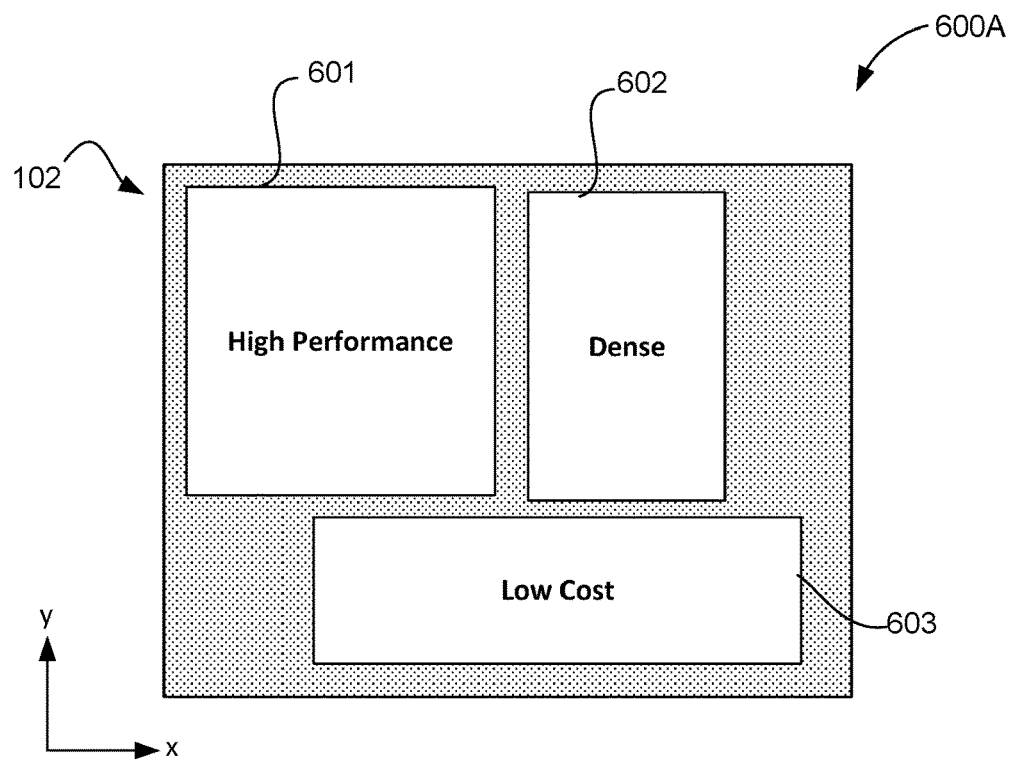
FIGS. 6A and 6B illustrate a plan view in the x-y plane of multiple chiplets integrated in host BEOL stacks in composite die structures, according to some embodiments of the disclosure.
Figure 6B:
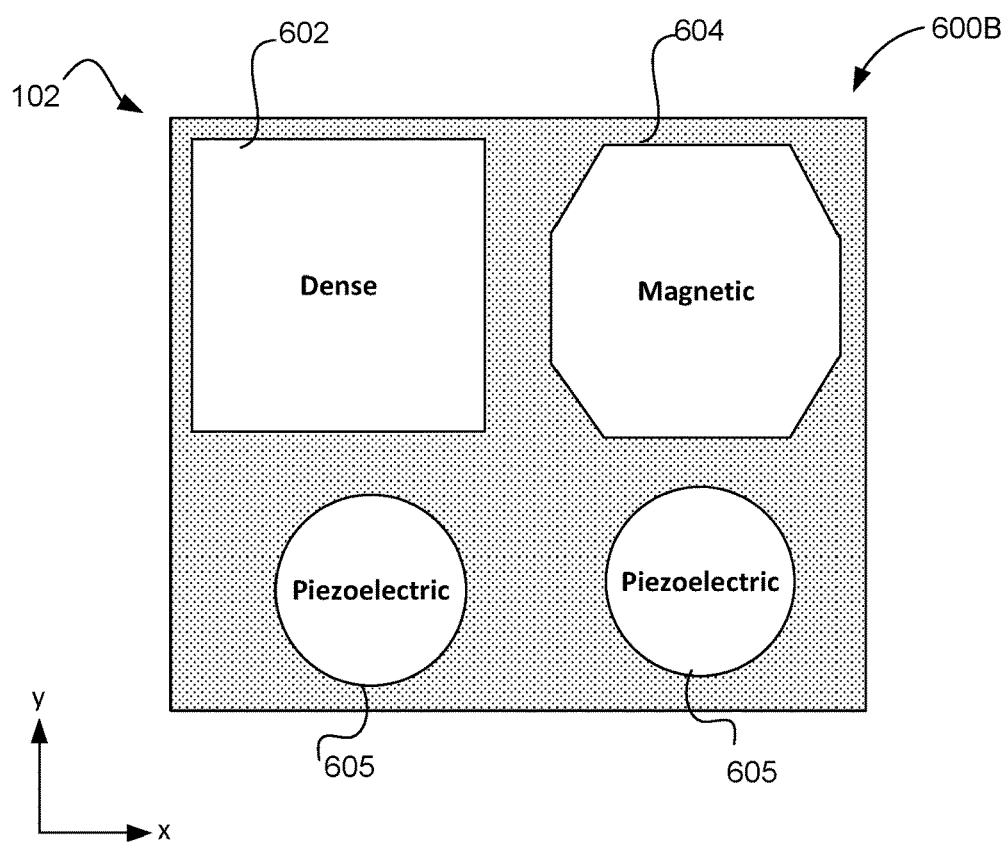

FIGS. 6A and 6B illustrate a plan view in the x-y plane of multiple chiplets integrated in host BEOL stacks in composite die structures 600A and 600B, according to some embodiments of the disclosure.

In FIG. 6A, a plan view is shown of a portion of composite die structure 600A. Host BEOL stack 102 comprises multiple interconnect chiplets 601, 602 and 603 arranged in an adjacent configuration. The three chiplets 601-603 are immediately adjacent to one another. Although three chiplets are shown in the illustrated embodiment, any suitable number of multiple chiplets may be configured in a two-dimensional arrangement such as shown in FIG. 6A. In some embodiments, chiplets 601-603 are separated laterally such that sidewalls (e.g. sidewalls 111) are adjacent to host BEOL stack sidewalls (e.g., sidewalls 113). The arrangement may be any suitable disposition of chiplets 601-603 in the x and y dimensions. Chiplets 601-603 are labelled "high performance", "dense" and "low cost", reflecting respective metallization densities. The label "high performance" for chiplet 601 may indicate a low-density, thick (e.g., large CD) metallization relative to host BEOL metallization, for high power, high speed routing requirements, similar to chiplet 201 in FIG. 2. The label "dense" for chiplet 602 may indicate a high density, small CD metallization relative to host BEOL metallization for high-density data routing requirements. The label "low cost" for chiplet 603 may indicate a compromise performance metallization.

In FIG. 6B, composite die structure 600B comprises magnetic chiplet 604 and piezoelectric chiplets 605 in addition to interconnect chiplet 602. In the illustrated embodiment, chiplets 602, 604 and 605 are arranged in disparate portions of host BEOL stack 102, having native stack 102 between sidewalls. Chiplets 604 and 605 are non-rectangular, and may have any arbitrary polygonal form, including circular (or generally curved) shapes, as shown in the example. Non-rectangular shapes may have functional purposes. As an example, circular shapes for piezoelectric layers (e.g., piezoelectric layers 408, FIG. 4) may enhance certain vibrational modes. Magnetic chiplets may be non-rectangular to accommodate specific geometries of inductors or for optimal magnetic shielding of portions of host circuitry. Chiplets 602, 604 and 605 may therefore have any suitable shape. In addition, non-rectangular functional layers may be formed in chiplets having a rectangular perimeter.

FIGS. 7A-H illustrate an exemplary process flow for composite die structure 300, according to some embodiments of the disclosure.

Figure 7A:
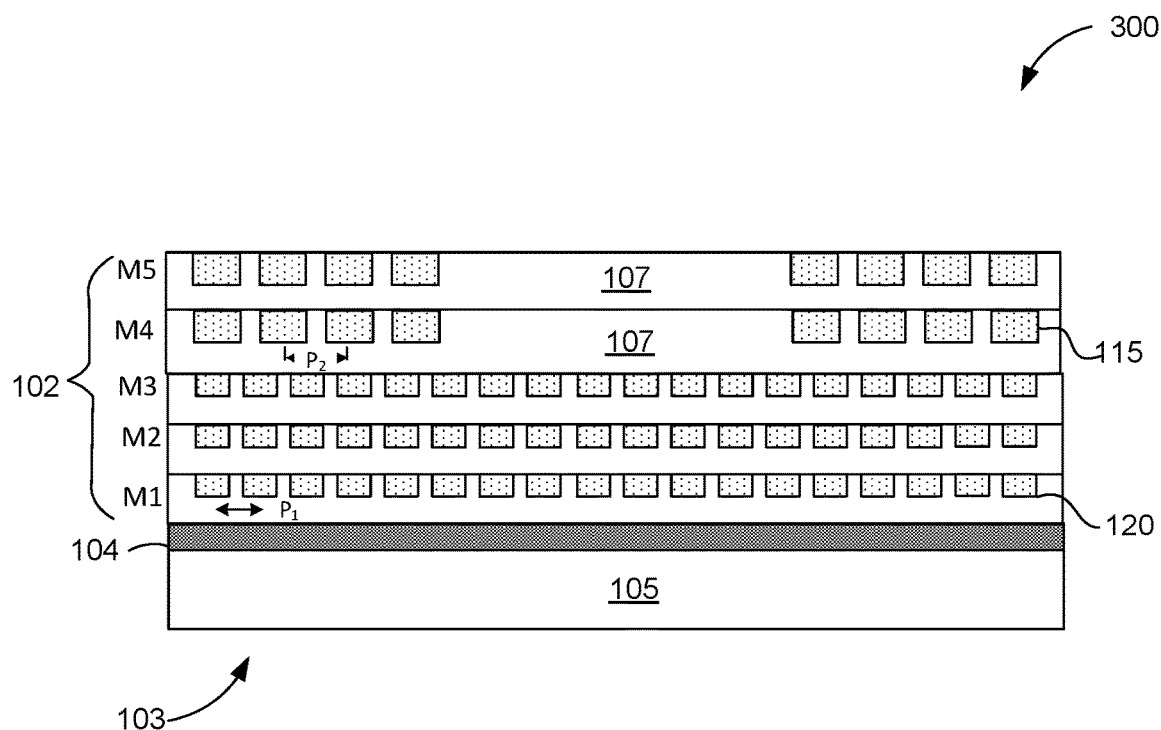
FIGS. 7A-7H illustrate an exemplary process flow for fabrication of a composite die structure, according to some embodiments of the disclosure.

In FIG. 7A, an in-process host die wafer 103 is received after completion of BEOL stack 102 to level M5, for example according to any suitable damascene fabrication techniques. Levels M1-M3 comprise relatively high density metallization structures 120 having pitch P1. A courser pitch (e.g. pitch P2 greater than P1) separates larger metallization features 115 in levels M4 and M5.

Substrate 105 of chiplet wafer 701 comprises a suitable semiconductor material, such as, but not limited to, silicon, silicon germanium, germanium, gallium arsenide, gallium indium arsenide or gallium nitride. In some embodiments, substrate 105 is a SOI wafer, having a BOX layer below device layer 104. Device layer 104 may comprise high-density integrated MOSFET transistors arranged in various n-MOS, p-MOS, CMOS or other classes of digital logic circuitry, as well as analog circuitry. In some embodiments, the device layer may comprise passive device such as resistors, capacitors, diodes and inductors. Local metallization within device layer 104 may be laid down to form transistor terminals and interconnect vias. Transistor terminals may have feature pitches that may range between 10-500 nm, and may be as small as 1-10 nm, for example. In some embodiments, a buried metallization layer is formed below gate, source and drain regions for backside contact. In some embodiments, transistor layers are present within BEOL stack 102. Metallization may be above and below BEOL stack-integrated transistor layers, which may have interconnect vias and through-silicon vias (TSVs) extending above and below the transistor layer to interconnect with metallization on both sides of the stack-integrated transistor layers.

Figure 7B:
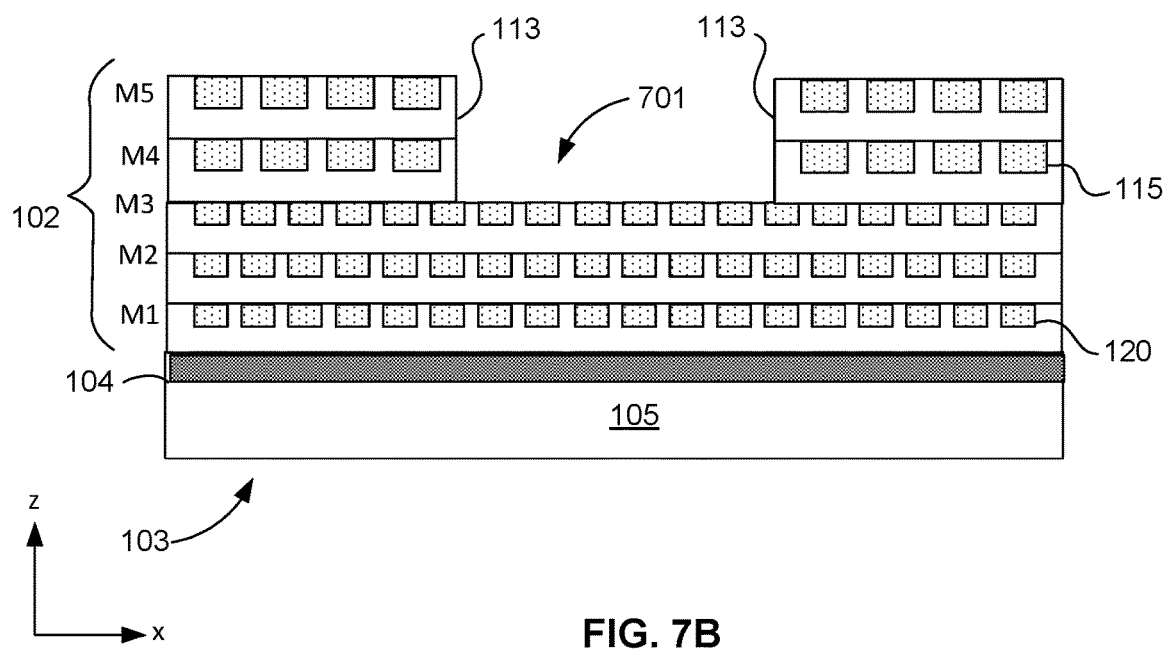

In FIG. 7B, recess 701 is formed in host BEOL stack 102 by etching back ILD associated with metallization layers M3, M4 and M5. In some embodiments, recess 701 may be formed by a high-aspect ratio anisotropic etch process, such as a deep reactive ionic etch (DRIE, e.g., a Bosch process) through a lithographically-defined etch mask having a hole pattern corresponding to chiplet positions. A dry etch process may produce substantially straight sidewalls 113. Recess 701 may be up to several hundred microns to several millimeters laterally, and up to several hundred nanometers to several or tens of microns deep. In the illustrated embodiment, recess 704 is etched to level M3. In some embodiments, an etch stop layer may be deposited after completion of the host BEOL stack 102 to a pre-determined level to avoid uncontrolled etching of ILD surrounding lower host metallization layers.

Figure 7C:
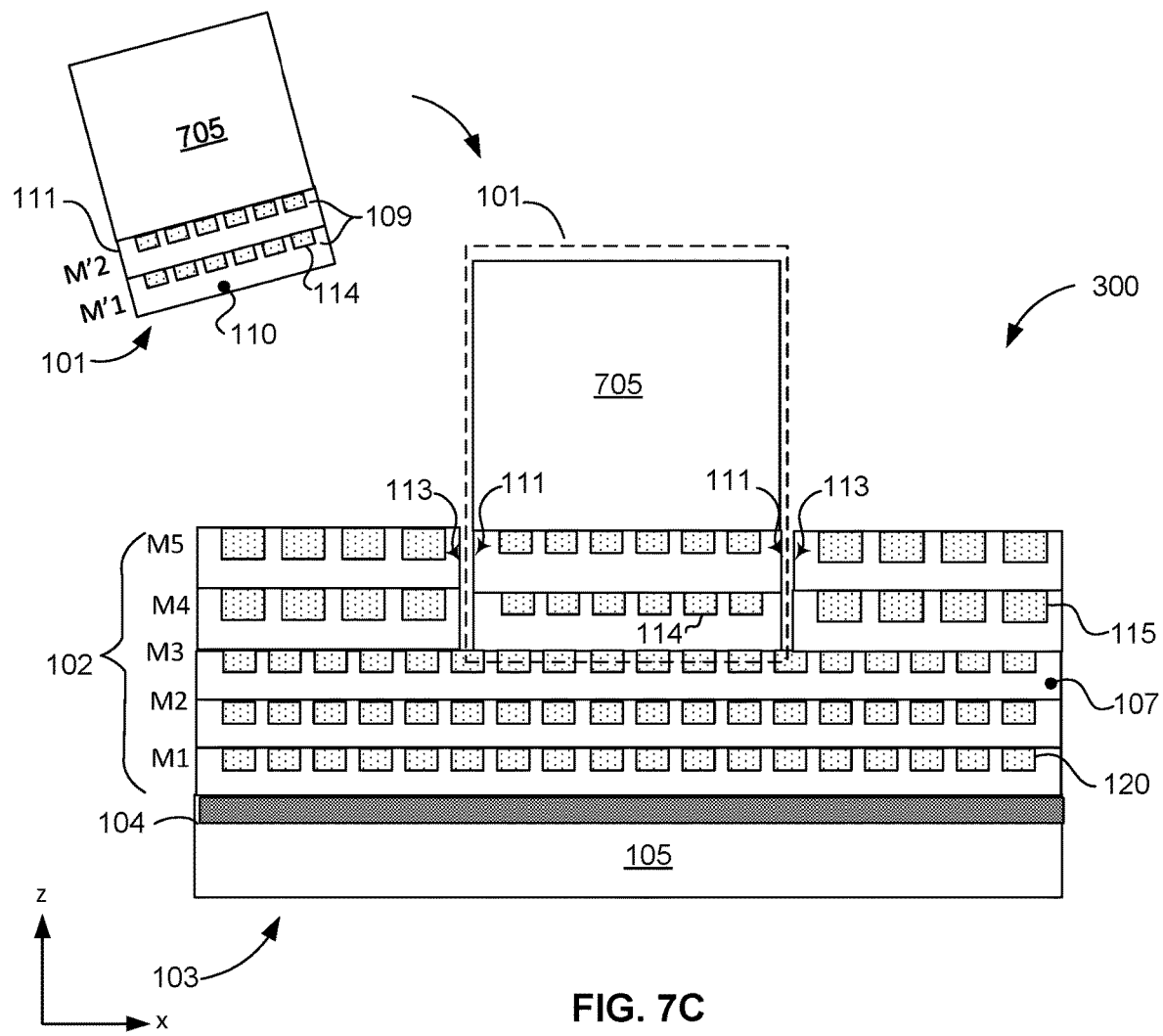

In FIG. 7C, interconnect chiplet 101 is attached to host BEOL stack 102 in a wafer-level process by insertion of chiplet(s) 101 into recess(es) 701. Multiple interconnect chiplets 101 may be singulated from a chiplet wafer (not shown) in separate fabrication process. A separate process for chiplet fabrication enables a plurality of interconnect chiplets having different interconnect densities to be fabricated. As an example, high-density interconnect chiplets (e.g., interconnect chiplet 101) and high-performance chiplets having lower interconnect densities (e.g., chiplet 201) may be manufactured according to different sets of design rules that are compatible with diverse circuits within device layer 104, as noted above. At wafer level, completed chiplets may be pre-tested for functionality and quality, accepting only reliable units. Multiple chiplets having an acceptable reliability may be integrated at wafer level into host chip metallization, forming the composite structures comprising host chip and embedded chiplets (e.g., composite die structure 100)

Interconnect chiplet 101 comprises two metallization levels M'1 and M'2, comprising conductive layers 109 embedded in ILD 110. Metallization levels M'1 and M'2 form the chiplet interconnect stack. Formation of metallization layers 109 may be performed by formation of ILD 110 and damascene metallization processes to create metallization layers 109, as employed for host BEOL stack 102, described below. Above M'2, no further metallization is present. A relatively thick handle substrate 705, for example comprising monocrystalline silicon, a dielectric, or any other material over which interconnects may have be formed upon, or transferred to, may facilitate chiplet handling. Complete chiplets (e.g., interconnect chiplet 101) may be singulated from a wafer and introduced to the host wafer BEOL process line after the partially complete metallization stack (e.g., host BEOL metallization stack 102) has been prepared for chiplet attachment (e.g., see FIG. 7B). In the illustrated embodiment of FIG. 7B, host BEOL stack 102 has been built up to level M5 and ILD subsequently selectively etched back to expose metal features of level M3, as shown in FIG. 7C.

A suitable chiplet attachment process may comprise a pick-and-place operation, inserting chiplet 101 into recess 701. In alternative embodiments, formation of recess 101 is omitted and/or attachment of chiplet 101 may be directly on the un-etched portions of exposed metallization level of BEOL stack 102. Individual chiplets 101 may be placed, or multiple chiplets up to several hundred at one time may be simultaneously inserted into etched recesses 701 at multiple locations over a partially complete BEOL metallization stack on a host wafer. In some embodiments, singulated chiplets 101 are received into a back-end of the line (BEOL) metallization process of a host chip wafer 103. In some embodiments, singulated chiplet dies may be attached to a handling tool (not shown) for mechanical support.

Recess(es) 701 may be etched to have a slightly larger footprint than interconnect chiplet 101, so that gaps remain between sidewalls 111 and 113. Bottom metallization features 114 may have a small placement misalignment relative to metallization features in M5, causing distances between sidewalls 111 and 113 to vary.

The wafer-level chiplet attach process may comprise a hybrid bonding process to the top-most metallization level of the host die that is completed before chiplet attachment. In this example level M3 is exposed at the bottom of recess 701, where metallization features 120 in level M3 are joined to bottom-level interconnects (e.g., metallization features 114) on the chiplet metallization stack (e.g, level M'1) by diffusion bonding of metal to metal contacts during hybrid bonding. ILD layers (e.g., host ILD 107 and chiplet ILD 110) are adhered by covalent bonds (e.g., condensation bonds between surface silanol groups). Multiple chiplet dies may be attached to a single host die at wafer level, and at more than one level in the BEOL stack on the host die.

After insertion and bonding of chiplet 101, handle substrate 705 may protrude a distance above M5 of host BEOL stack 102. M'1 and M'2 are seated within recess 704 below M5, and may be substantially in plane with host metallization levels M4 and M5, as shown in FIG. 7C.

Chiplet 101 is bonded to host stack metal structures 702 and ILD 107 at the bottom of recess 704 as described above. A fill dielectric (e.g., fill dielectric 112) may be deposited at wafer level in gaps between chiplet 101 and host BEOL stack. The fill dielectric may be a PECVD dielectric, spin-on glass (e.g. sol-gel glass or organosilicate glss) or an organic polymeric resin composite, such as an epoxy resin. Fill dielectric 112 may stabilize the bonded chiplet on the host wafer by potting the chiplet, increasing adhesion to the host die. Before or after application of fill dielectric 112, chiplet 101 may be planarized, and/or handle substrate 705 otherwise removed. The planarization operation may be performed by a chemical-mechanical process, or etch process or a combination thereof for example.

Figure 7D:
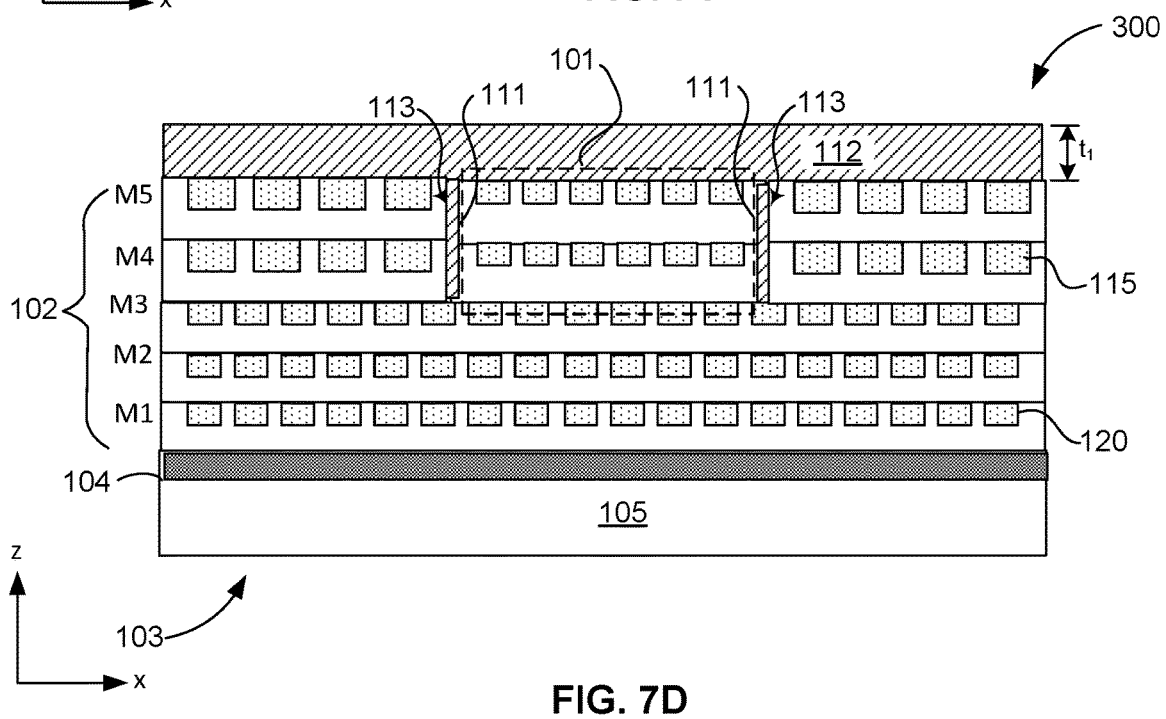

In FIG. 7D, fill dielectric 112 is deposited over chiplet 101 and top of host BEOL stack 102. Gaps between sidewalls 111 and 113 are backfilled, increasing adhesion of chiplet 101 to the host stack. The layer of fill dielectric 112 over M5 may be deposited to any suitable thickness and planarized back to a predetermined thickness. For example, fill dielectric 112 may be polished back to a thickness t1, matching the thickness of levels M4 and M5. Fill dielectric 112 may cover the entire BEOL stack 102. Optionally, native ILD 107 material may be employed to backfill gaps between chiplet 101 and native BEOL stack and form ILD in level M6. Material used in ILD 107 may be a higher performance dielectric than fill dielectric 112. For example, native ILD 107 may have a smaller permittivity (k) than fill dielectric 112 to reduce capacitance between metallization structures. In some embodiments, incorporation of fill dielectric 112 within M6 is an alternative to complete removal of excess fill dielectric 112 down to M5 and subsequent deposition of native ILD 107. Metallization features 115 may be formed in fill dielectric 305 in M6 and any coplanar native ILD 107 by a Damascene process.

Figure 7E:
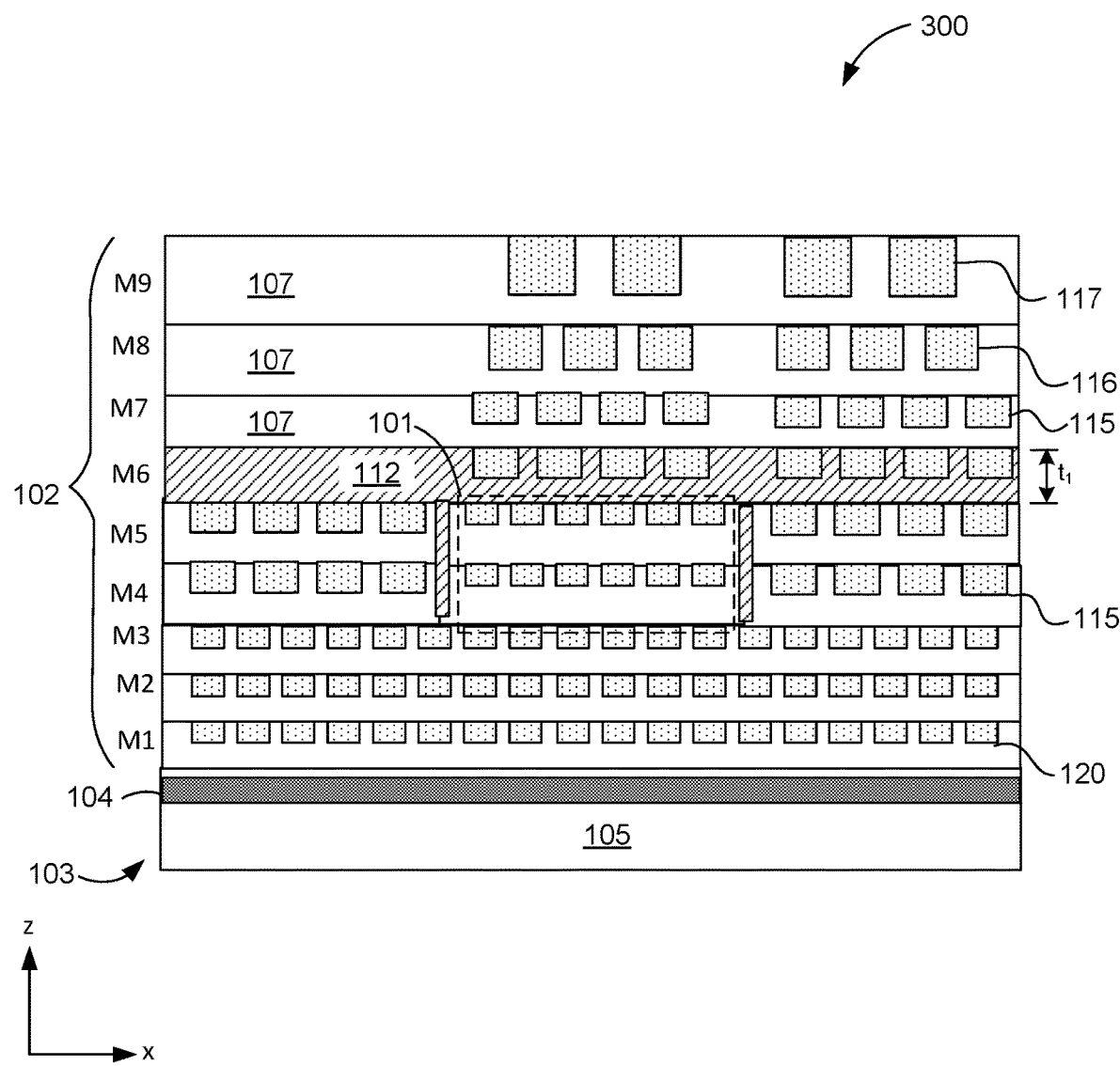

In FIG. 7E, any suitable damascene metallization process is continued after bonding chiplet 101 to form upper levels of host BEOL stack 102. Host BEOL metallization levels M6 (in fill dielectric 112), M7, M8 and M9 may be added in succession. The host metallization processes may include formation of ILD layer(s) 107 and metallization layer(s) 106 over fill dielectric M6. In some embodiments, ILD layers 107 (and subsequent ILD layers) may comprise inorganic crystalline dielectric materials such as, but not limited to, silicon oxides, silicon nitrides, silicon oxynitrides, silicon carbides, silicon carbide nitrides, silicon oxycarbides, aluminum oxides and aluminum nitrides.

In some embodiments, ILD 107 comprises amorphous silicate materials such as, but not limited to, undoped silicate glass (USG) and fluorosilicate glass (FSG), deposited by CVD techniques or as a spin-on glass (SOG). In some embodiments, ILD 107 comprises organic dielectrics such as, but not limited to, epoxy resins, polyimides, polynorborenes, benzocyclobutene, poly tetrafluoroethylene (PTFE), hydrogen silsesquioxane and methyl silsesqjuioxane. ILD layers 107 may be deposited to a thickness of 1000 nm or less (e.g., 200-500 nm) to support formation of high-density interconnects to transistors in device layer 104. Deposition of these materials may be performed by methods including, but not limited to, RF sputtering, atomic layer deposition, chemical vapor deposition, and wet chemical methods such as TEOS (tetraethyl orthosilicate) processes. Also included are spin-coating techniques (e.g., spin-on glass, SOG). ILD 107 and fill dielectric 112 may be deposited by chemical vapor deposition processes such as plasma-enhanced chemical vapor deposition (PECVD) and low-pressure chemical vapor deposition (LPCVD). Layer thicknesses may range between 50 nm to several microns.

In general, the layer thickness may incrementally increase as the number of stack levels increase. The number of levels in host BEOL metallization stack 102 may depend on minimum feature pitch required to substantially match the minimum features pitch in the chiplet interface layer of the BEOL metallization stack of the host chip (e.g., pitch P2 in FIG. 1). For relatively large interconnect sizes and pitches that may be present at a specific BEOL layer in the host chip metallization stack (e.g., BEOL metallization stack 102) at which the chiplet is attached, more metallization levels may be required to expand the fine feature CD's and pitch proximal to the chiplet for example to expand from pitch P1 of device layer 104 to P2 at the chiplet-host wafer interface (see FIG. 1).

Several suitable metal deposition processes may be employed to produce metallization features (e.g. 115-117). Metal deposition may be performed by electroplating of metals such as copper, gold or nickel into the etched features, and may be employed in Damascene metallization processes. Preceding electroplating, first a barrier layer followed by an electroplating seed layer may be deposited as thin films into the etched features. A barrier layer may comprise a conformal titanium, titanium nitride or tantalum nitride film in direct contact with the dielectric, for example to prevent diffusion and contamination by atoms of metallization metal. The barrier layer may be 1 to 5 nm thick, for example. The seed layer may comprise the same metal as that plated, such as copper. Barrier and seed layers may be deposited by any suitable physical deposition technique, such as RF and/or DC sputtering, or by vacuum evaporation of metals. In some other embodiments, metal structures may be formed by electroless deposition.

Damascene metallization includes etching of trenches and via holes (not shown) by etch processes described above, in the ILD layers. Trenches and via holes may form deposition beds for metallization features such as pads and traces and inter-level vias (not shown). In single Damascene processes, metal is deposited into etched via openings and trenches by two successive iterations of a single Damascene process or a dual Damascene process. In a first single Damascene iteration, either vias or trenches are formed, then filled by a first metal deposition and planarized (e.g., by chemical-mechanical polishing, CMP) to remove the overburden (e.g., overfill) and cause the metallization to be planar with the dielectric surface. The first Damascene process is followed by a second Damascene process, where trenches are formed if vias were formed first, or vice-versa. The second etched features are filled by second metal deposition, then planarized a second time to remove any overburden Thus, the metal features are sunken below the level the ILD, enabling a low z-height of the multi-level stack. In a dual Damascene process, via holes and trace and/or pad trenches are formed before metallization. A single metal deposition is employed, filling both via holes and trenches simultaneously.

Figure 7F:
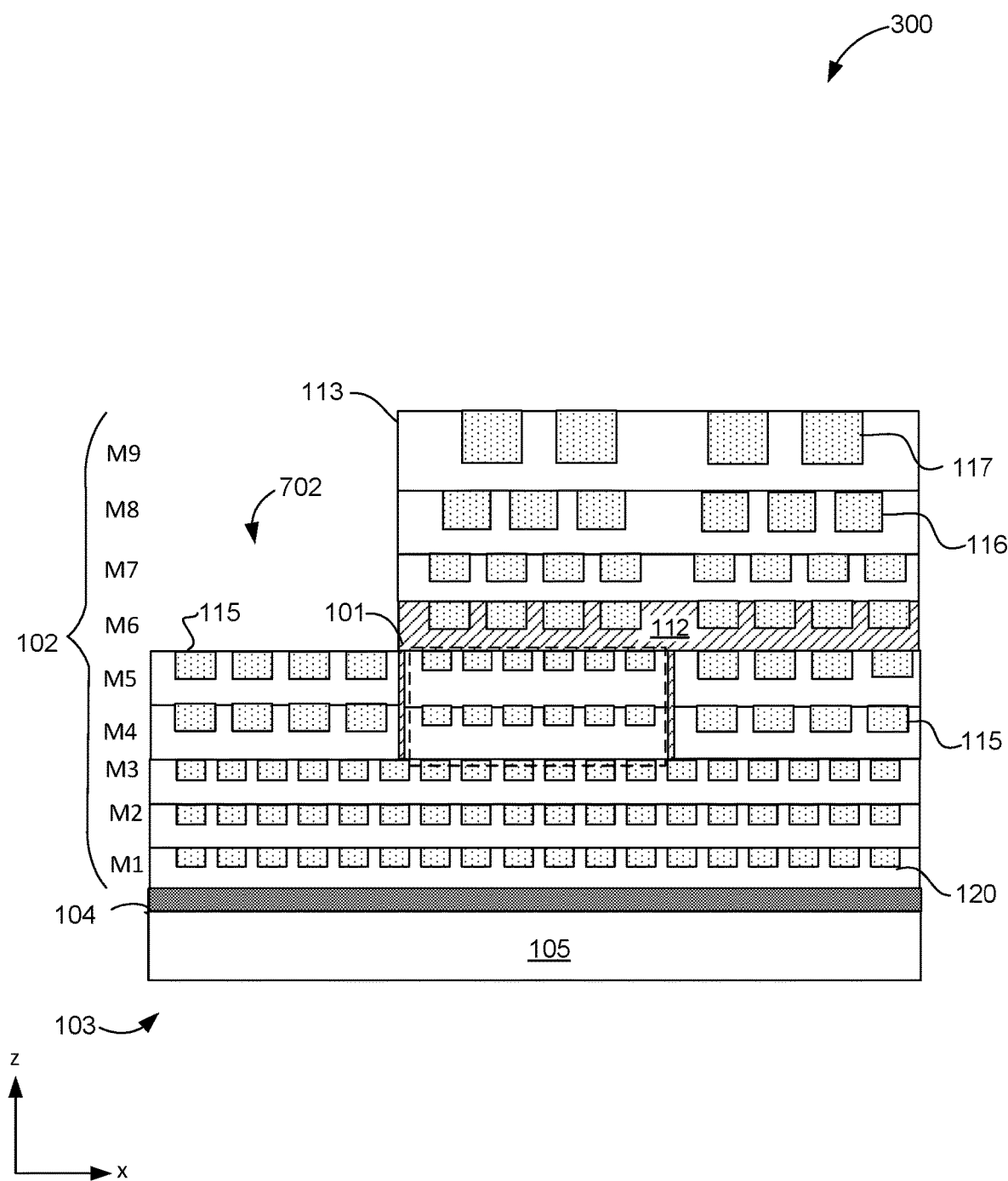

In FIG. 7F, host BEOL ILD material adjacent to chiplet 101 is removed by an etch process, forming recess 702 adjacent to chiplet 101. Sidewall 111 of chiplet 101 is exposed. A portion of metallization level M5 is exposed as well, forming bottom of recess 702. Interconnect features in M5 will become part of the attachment surface for a second chiplet integration. A second sidewall of recess 702 (e.g., sidewall 113) is not shown but implied. Etching processes may be substantially the same as those described above for formation of recess 701. As an example, a DRIE (e.g., Bosch) process may be employed for a through-mask etch process to form a lithographically defined recess 702. A Bosch process may be optimal for formation of straight sidewalls (e.g., sidewall 113, not shown). Recess 702 may be etched to produce a larger footprint than interconnect chiplet 301.

Figure 7G:
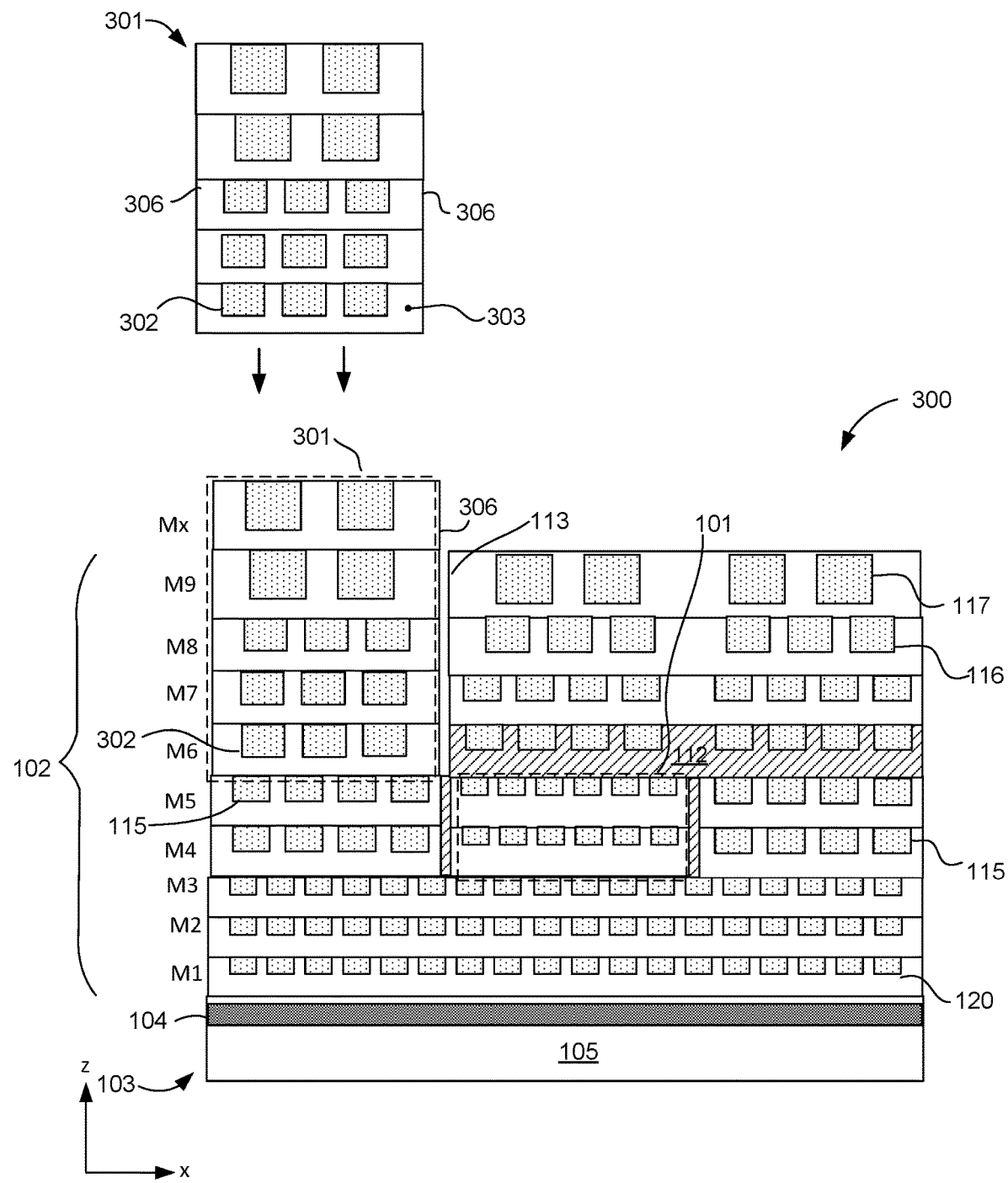

FIG. 7G illustrates attachment of interconnect chiplet 301. In some embodiments, attachment of chiplet 301 may be performed by a wafer-level pick-and-place operation. Individual chiplets 301 may be attached to host BEOL stack 102 by insertion of chiplet(s) 301 into recess(es) 702 formed in host BEOL stack 102. The pick-and-place operation may have an accuracy tolerance of several tens to hundreds of nanometers, and introduce some alignment offset between chiplet metallization features 114 and BEOL metallization stack pads 115. In some embodiments, chiplet(s) 301 is (are) hybrid-bonded to level M5 in host BEOL metallization 102.

Hybrid bonding may be performed by pick and place operation followed by thermal anneal of the assembly comprising chiplet 301 (and 101) and host chip wafer 103. Chiplet 301 may have a metallization density that is substantially different from host BEOL metallization density. In the illustrated embodiment, chiplet 301 is a relatively low-density, larger CD interconnect stack, optimal for high performance circuitry in the portion of device layer 104 below chiplet 201.

In the illustrated embodiment, the layer count of interconnect chiplet 301 is greater than the number of host layers removed to create recess 702. As a consequence, interconnect chiplet 301 is not planar with the host BEOL stack. Chiplet 301 introduces an incomplete metallization layer extending above the host level M9.

Figure 7H:
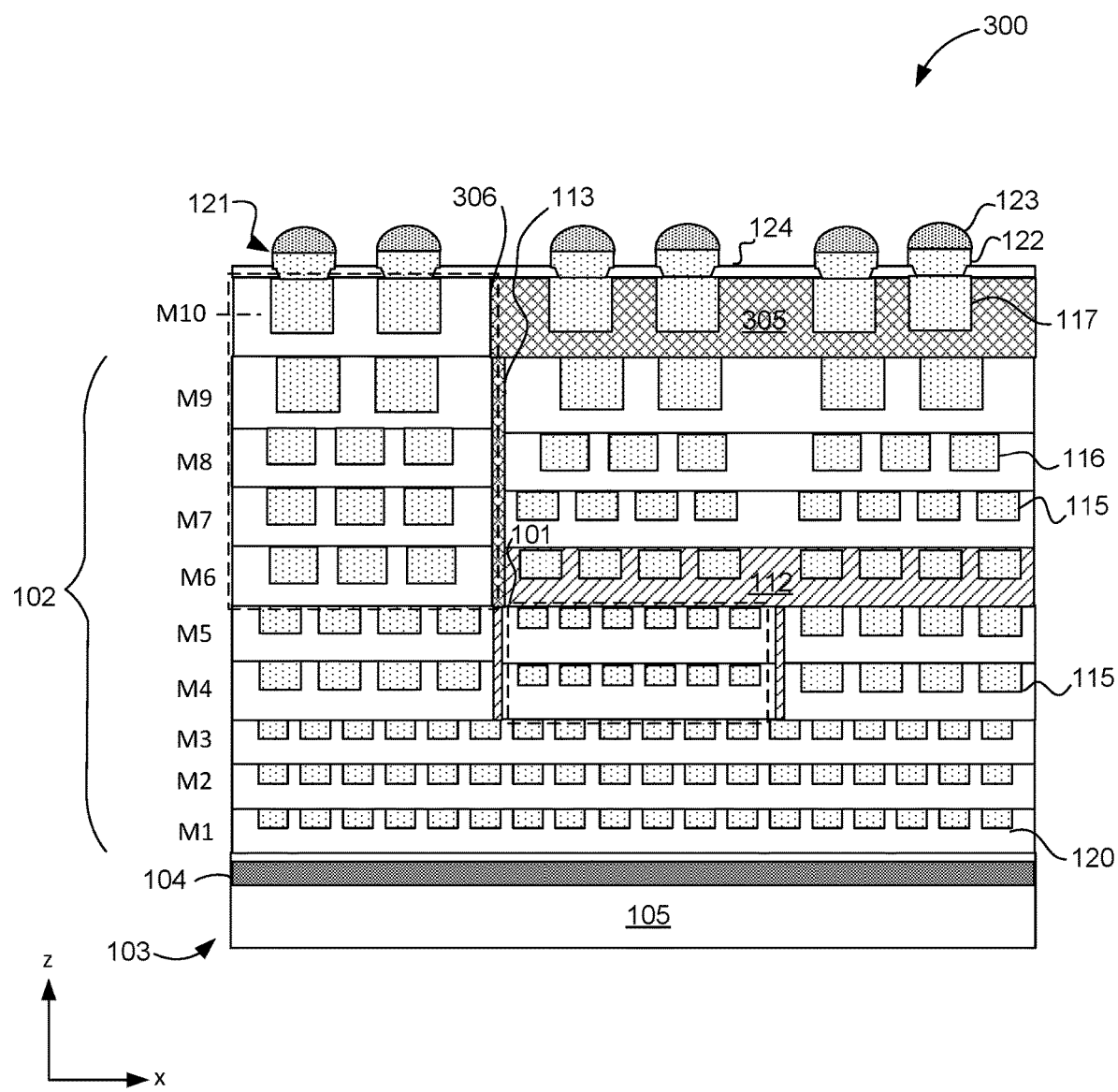

In FIG. 7H, a second fill dielectric material 305 has been deposited over host level M9 to backfill the gaps between sidewalls 306 of chiplet 301 and sidewalls 113 of recess 702. Deposition of fill dielectric 305 forms an ILD layer above host level M9, which may polished to planarize host BEOL stack 102 with interconnect chiplet 301. In some embodiments, fill dielectric 305 comprises substantially the same material as fill dielectric 112. In some embodiments, fill dielectric comprises native ILD dielectric. Fill dielectric 305 may subsequently be planarized to the level of the retained interconnect levels of chiplet 301. A CMP operation may be employed to polish fill dielectric 305 to be planar with the top of chiplet 301.

Operations on host chip wafer 103 may be terminated by formation of a FLI interface layer 121 (including interconnect pads 122 and solder bumps 123) as a final metallization and ILD formation operation. Interconnect pads 121 are grown over metallization features 117 in level M10. Vertical connections from levels M9 and M10 may be made by inter-level vias (not shown). Assembly operations may then continue, for example, following host chip singulation, reconstitution, and application of FLI solder bumps 123 through solder mask (or passivation) 124 according to any suitable technique for fan-out or conversely FLI solder bump application with passivation 124, singulation and attachment to a package.

Figure 8:
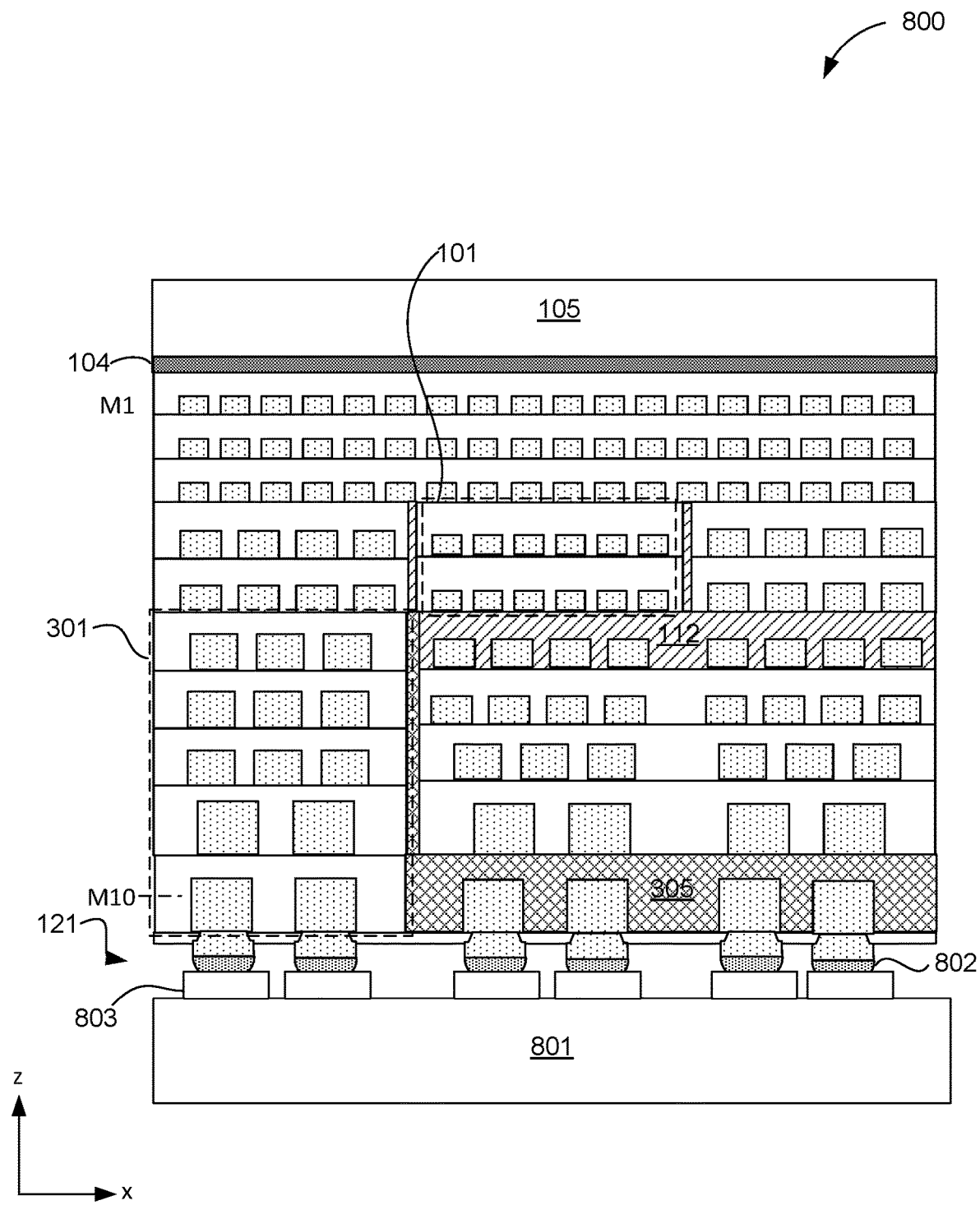
FIG. 8 illustrates a system comprising a composite die structure coupled to a package or interposer substrate, according to some embodiments of the disclosure.

FIG. 8 illustrates system 800 comprising composite die structure 300 coupled to a package or interposer substrate 801, according to some embodiments of the disclosure. System 800 comprises composite die structure 300 bonded to a package substrate or interposer 801 by FLI solder joints 802 to substrate pads 803. Interconnect chiplets 101 and 301 are integrated adjacently in composite die structure 300, as described in FIGS. 7A-7H. Chiplets 101 and 301 may be coupled to routing within substrate 801 that delivers high speed or high density signals to sections of integrated circuitry underlying each chiplet, optimally routing signals through host BEOL stack 102 to target circuits in device layer 104.

Figure 9:
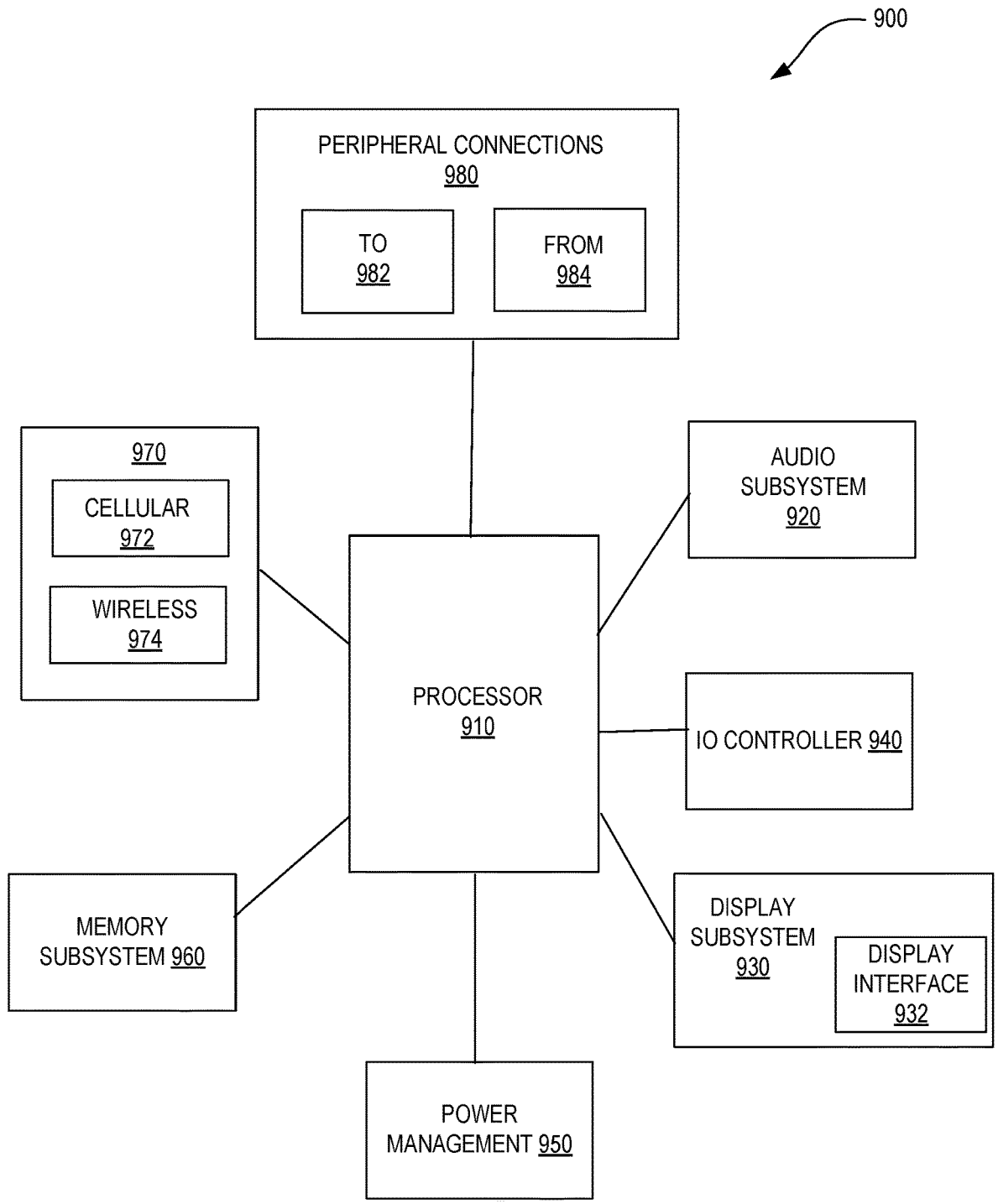
FIG. 9 illustrates a block diagram of a computing device as part of a system-on-chip (SoC) package comprising a composite die structure in an implementation of a computing device, according to some embodiments of the disclosure.

FIG. 9 illustrates a block diagram of computing device 900 as part of a system-on-chip (SoC) package comprising a composite die (e.g., any of composite die structure 100, 200, 300 or 700 disclosed herein) in an implementation of a computing device, according to some embodiments of the disclosure.

According to some embodiments, computing device 900 represents a server, a desktop workstation, or a mobile workstation, such as, but not limited to, a laptop computer, a computing tablet, a mobile phone or smart-phone, a wireless-enabled e-reader, or other wireless mobile device. An IC package, such as, but not limited to, a single- or multi-core microprocessor (e.g., representing a central processing unit. In some embodiments, the IC package comprises a composite die structure (e.g., any of composite die structures 100, 200, 300 or 700), comprising a chiplet die (e.g., any of chiplet dies 101, 201, 301, 501, 502, 601, 602, 603, 604 or 605 disclosed herein), according to the embodiments of the disclosure.

In some embodiments, computing device has wireless connectivity (e.g., Bluetooth, WiFi and 5G network). It will be understood that certain components are shown generally, and not all components of such a device are shown in computing device 1100.

The various embodiments of the present disclosure may also comprise a network interface within 970 such as a wireless interface so that a system embodiment may be incorporated into a wireless device, for example, cell phone or personal digital assistant. The wireless interface includes a millimeter wave generator and antenna array.

According to some embodiments, processor 910 represents a CPU or a GPU, and can include one or more physical devices, such as microprocessors, application processors, microcontrollers, programmable logic devices, or other processing means. The processing operations performed by processor 910 include the execution of an operating platform or operating system on which applications and/or device functions are executed. The processing operations include operations related to I/O (input/output) with a human user or with other devices, operations related to power management, and/or operations related to connecting the computing device 900 to another device. The processing operations may also include operations related to audio I/O and/or display I/O.

In one embodiment, computing device 900 includes audio subsystem 920, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 900, or connected to the computing device 900. In one embodiment, a user interacts with the computing device 900 by providing audio commands that are received and processed by processor 910

Display subsystem 930 represents hardware (e.g., display devices) and software (e.g., drivers) components that provide a visual and/or tactile display for a user to interact with the computing device 900. Display subsystem 930 includes display interface 932 which includes the particular screen or hardware device used to provide a display to a user. In one embodiment, display interface 932 includes logic separate from processor 910 to perform at least some processing related to the display. In one embodiment, display subsystem 930 includes a touch screen (or touch pad) device that provides both output and input to a user.

I/O controller 940 represents hardware devices and software components related to interaction with a user. I/O controller 940 is operable to manage hardware that is part of audio subsystem 920 and/or display subsystem 930. Additionally, I/O controller 940 illustrates a connection point for additional devices that connect to computing device 900 through which a user might interact with the system. For example, devices that can be attached to the computing device 900 might include microphone devices, speaker or stereo systems, video systems or other display devices, keyboard or keypad devices, or other I/O devices for use with specific applications such as card readers or other devices.

As mentioned above, I/O controller 940 can interact with audio subsystem 920 and/or display subsystem 930. For example, input through a microphone or other audio device can provide input or commands for one or more applications or functions of the computing device 900. Additionally, audio output can be provided instead of, or in addition to display output. In another example, if display subsystem 930 includes a touch screen, the display device also acts as an input device, which can be at least partially managed by I/O controller 940. There can also be additional buttons or switches on the computing device 900 to provide I/O functions managed by I/O controller 940.

In one embodiment, I/O controller 940 manages devices such as accelerometers, cameras, light sensors or other environmental sensors, or other hardware that can be included in the computing device 900. The input can be part of direct user interaction, as well as providing environmental input to the system to influence its operations (such as filtering for noise, adjusting displays for brightness detection, applying a flash for a camera, or other features).

In one embodiment, computing device 900 includes power management 950 that manages battery power usage, charging of the battery, and features related to power saving operation. Memory subsystem 960 includes memory devices for storing information in computing device 900. Memory can include nonvolatile (state does not change if power to the memory device is interrupted) and/or volatile (state is indeterminate if power to the memory device is interrupted) memory devices. Memory subsystem 960 can store application data, user data, music, photos, documents, or other data, as well as system data (whether long-term or temporary) related to the execution of the applications and functions of the computing device 900.

Elements of embodiments are also provided as a machine-readable medium (e.g., memory 960) for storing the computer-executable instructions. The machine-readable medium (e.g., memory 960) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 970 includes hardware devices (e.g., wireless and/or wired connectors and communication hardware) and software components (e.g., drivers, protocol stacks) to enable the computing device 900 to communicate with external devices. The computing device 900 could be separate devices, such as other computing devices, wireless access points or base stations, as well as peripherals such as headsets, printers, or other devices.

Network interface 970 can include multiple different types of connectivity. To generalize, the computing device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 974 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 980 include hardware interfaces and connectors, as well as software components (e.g., drivers, protocol stacks) to make peripheral connections. It will be understood that the computing device 900 could both be a peripheral device ("to" 982) to other computing devices, as well as have peripheral devices ("from" 984) connected to it. The computing device 900 commonly has a "docking" connector to connect to other computing devices for purposes such as managing (e.g., downloading and/or uploading, changing, synchronizing) content on computing device 900. Additionally, a docking connector can allow computing device 900 to connect to certain peripherals that allow the computing device 900 to control content output, for example, to audiovisual or other systems.

In addition to a proprietary docking connector or other proprietary connection hardware, the computing device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an integrated circuit (IC) device structure, comprising a host chip comprising a device layer and one or more first metallization levels over adjacent first and second regions of the device layer, the first metallization levels interconnected to the device layer; an interconnect chiplet over the first metallization levels within the first region, the interconnect chiplet comprising a plurality of second metallization levels; and a plurality of third metallization levels over the first metallization levels within the second region, and adjacent to the interconnect chiplet, wherein at least one of an interconnect feature dimension or composition differs between one of the second metallization levels and an adjacent one of the third metallization levels.

Example 2 includes all of the features of example 1, wherein a dielectric material is between one or more sidewalls of the chiplet and the third metallization levels.

Example 3 includes all of the features of example 2, wherein the dielectric material surrounds a perimeter of the chiplet.

Example 4 includes all of the features of any one of examples 1 through 3, further comprising one or more top metallization levels extending over both the second and third metallization levels.

Example 5 includes all of the features of any one of examples 1 through 4, wherein a first feature of the first metallization layer is in direct contact with a second feature of the second metallization levels, and a dielectric material surrounding the first feature is in direct contact with a dielectric material surrounding the second feature.

Example 6 includes all of the features of example 5, wherein a second feature of the first metallization layer is in direct contact with a third feature of the third metallization levels, and wherein a lateral offset between a sidewall of first feature and a sidewall of the second feature of the second metallization levels is larger than a lateral offset between a sidewall of the second feature of the first metallization levels and a sidewall of the third feature.

Example 7 includes all of the features of any one of examples 1 through 6, wherein a first of the second or third metallization levels comprises predominantly Cu, and a second of the second or third metallization levels comprise predominantly other than Cu.

Example 8 includes all of the features of any one of examples 1 through 7, wherein the second metallization levels are separated by a first dielectric material having a relative permittivity different from that of a second dielectric material separating the third metallization levels.

Example 9 includes all of the features of any one of examples 1 through 8, wherein the interconnect chiplet is a first chiplet, wherein a second interconnect chiplet comprises the third metallization levels; and wherein a dielectric material is between a sidewall of the first chiplet and a sidewall of the second chiplet.

Example 10 includes all of the features of example 9, wherein the one or more first metallization levels comprises one or more lower metallization levels over both the first and second regions of the device layer, and one or more upper metallization levels over just the second region of the device layer, wherein a first feature of the second metallization levels is in direct contact with a first feature of the lower metallization levels, and a first feature of the third metallization levels is in direct contact with a first feature of the upper metallization levels.

Example 11 includes all of the features of example 10, further comprising a second chiplet over a third region of the device layer, the second chiplet comprising a plurality of fourth metallization levels, and wherein. at least one of an interconnect feature pitch, composition, or thickness differs between one of the fourth metallization levels and an adjacent one of the second or third metallization levels.

Example 12 includes all of the features of example 11, further comprising one or more top metallization levels extending over two or more of the second, third and fourth metallization levels.

Example 13 includes all of the features of example 12, further comprising first level interconnects in contact with an uppermost one of the top metallization levels.

Example 14 includes all of the features of any one of examples 1 through 13, wherein the chiplet comprises a magnetic material between two interconnect features in one of the second metallization levels, or between two of the second metallization levels.

Example 15 includes all of the features of any one of examples 1 through 14, wherein the chiplet comprises a piezoelectric material between two interconnect features in one of the second metallization levels, or between two of the second metallization levels.

Example 16 is a system comprising a microprocessor chip comprising, transistors in a first region and an adjacent second region of the chip, one or more first metallization levels over the first and second regions and interconnected to the transistors, an interconnect chiplet over the first metallization levels within the first region, the interconnect chiplet comprising a plurality of second metallization levels; a plurality of third metallization levels over the first metallization levels within the second region, and adjacent to the interconnect chiplet, wherein at least one of an interconnect feature dimension or composition differs between one of the second metallization levels and an adjacent one of the third metallization levels; and one or more top metallization levels extending over the second and third metallization levels; and first level interconnects in contact with an uppermost one of the top metallization levels and in contact with another chip or host substrate.

Example 17 includes all of the features of example 16, further comprising a power supply coupled to power the microprocessor chip.

Example 18 is a method for forming an IC device structure, comprising forming one or more first metallization levels over a first and second region of a device layer, placing an interconnect chiplet on the one or more first metallization levels, the interconnect chiplet comprising a plurality of second metallization levels, bonding a feature of the second metallization levels to a feature of the lower one of the first metallization levels, and forming one or more top metallization levels over the interconnect chiplet and over the uppermost one of the first metallization levels within the second region of the device layer.

Example 19 includes all of the features of example 18, wherein placing an interconnect chiplet on the one or more first metallization levels comprises first forming a cavity within at least the uppermost one of the first metallization levels, the cavity exposing a lower one of the first metallization levels between the first region of the device layer and the uppermost metallization layer.

Example 20 includes all of the features of example 19, wherein forming the cavity further comprising etching a dielectric material between features of the uppermost one of the first metallization levels to first depth, wherein the interconnect chiplet has a z-height approximately equal to the first depth; and wherein forming the top metallization levels further comprises planarizing the dielectric material and performing a damascene metallization process.

An abstract is submitted with the understanding that it will not be used to limit the scope or meaning of the claims. The following claims are hereby incorporated into the detailed description, with each claim standing on its own as a separate embodiment.

We claim:

1. An integrated circuit (IC) device structure, comprising:
   a host chip comprising a device layer and a first metallization level over adjacent first and second regions of the device layer, the first metallization level interconnected to the device layer;
   an interconnect chiplet over the first metallization level within the first region, the interconnect chiplet consisting of metallization levels embedded in dielectric material, the metallization levels comprising a second metallization level; and
   a third metallization level over the first metallization level within the second region, and adjacent to the second metallization level, wherein an interconnect feature composition differs between the second metallization level and the third metallization level.

2. The IC device structure of claim 1, wherein a second dielectric material is between one or more sidewalls of the chiplet and the third metallization level.

3. The IC device structure of claim 2, wherein the second dielectric material surrounds a perimeter of the chiplet.

4. The IC device structure of claim 1, further comprising a top metallization level extending over both the second and third metallization levels.

5. The IC device structure of claim 1, wherein a first feature of the first metallization level is in direct contact with a second feature of the second metallization level, and a dielectric material surrounding the first feature is in direct contact with a dielectric material surrounding the second feature.

6. The IC device structure of claim 5, wherein a second feature of the first metallization level is in direct contact with a third feature of the third metallization level, and wherein a lateral offset between a sidewall of the first feature and a sidewall of the second feature of the second metallization level is larger than a lateral offset between a sidewall of the second feature of the first metallization level and a sidewall of the third feature.

7. The IC device structure of claim 1, wherein a first feature of the second or third metallization level comprises predominantly Cu, and a second feature of the second or third metallization level comprises predominantly other than Cu.

8. The IC device structure of claim 1, wherein the dielectric material is an inorganic composition having a relative permittivity different from that of another dielectric material surrounding the third metallization level.

9. The IC device structure of claim 1, wherein:
   the interconnect chiplet is a first chiplet;
   a second interconnect chiplet comprises the third metallization level; and
   another dielectric material is between a sidewall of the first chiplet and a sidewall of the second chiplet.

10. The IC device structure of claim 1, further comprising a second chiplet over a third region of the device layer, the second chiplet comprising a fourth metallization level, and wherein an interconnect feature composition, differs between the fourth metallization level and an adjacent one of the second or third metallization level.

11. The IC device structure of claim 10, further comprising a top metallization level extending over two or more of the second, third and fourth metallization levels.

12. The IC device structure of claim 11, further comprising first level interconnects in contact with the top metallization level.

13. The IC device structure of claim 1, wherein the chiplet comprises a magnetic material between two interconnect features in one of the second metallization levels, or between two of the second metallization levels.

14. The IC device structure of claim 1, wherein the chiplet comprises a piezoelectric material between two interconnect features in one of the second metallization levels, or between two of the second metallization levels.

15. A system, comprising:
a microprocessor chip, comprising:
  transistors in a first region and an adjacent second region of the chip;
  a first metallization level over the first and second regions and interconnected to the transistors;
  an interconnect chiplet over the first metallization level within the first region, the interconnect chiplet consisting of metallization levels embedded in dielectric material, the metallization levels comprising a second metallization level;
  a third metallization level over the first metallization level within the second region, and adjacent to the second metallization level, wherein an interconnect feature composition differs between the second metallization level and the third metallization level; and
  a top metallization level extending over the second and third metallization levels; and
first level interconnects in contact with the top metallization level and in contact with another chip or host substrate.

16. The system of claim 15, further comprising a power supply coupled to the microprocessor chip to provide power to the microprocessor chip.

* * * * *